(12) United States Patent
Picha et al.

(10) Patent No.: US 6,504,426 B2
(45) Date of Patent: Jan. 7, 2003

(54) METHODS AND SYSTEMS FOR POWER AMPLIFYING OF SIGNALS

(76) Inventors: Guy Picha, 11A/511 Ben Gurion Street, Givat Shmuel (IL), 54017; Amir Katz, 9 Kaplan Street, Tel Aviv (IL), 64734

( * ) Notice: Subject to any disclaimer, the term of this patent is extended or adjusted under 35 U.S.C. 154(b) by 0 days.

(21) Appl. No.: 09/820,178

(22) Filed: Mar. 28, 2001

(65) Prior Publication Data

US 2002/0171475 A1 Nov. 21, 2002

(51) Int. Cl.[7] .................................................. H03F 3/38
(52) U.S. Cl. ...................... 330/10; 330/207 A; 330/251
(58) Field of Search ................................ 330/10, 207 A, 330/251

(56) References Cited

U.S. PATENT DOCUMENTS

| | | | |
|---|---|---|---|
| 3,772,606 A | 11/1973 | Waehner | 330/13 |
| 3,961,280 A | 6/1976 | Sampei | 330/40 |
| 4,178,556 A | 12/1979 | Attwood | 330/10 |
| 4,598,255 A | 7/1986 | Hong | 330/297 |
| 5,101,172 A | 3/1992 | Ikeda et al. | 330/136 |
| 5,396,194 A | 3/1995 | Williamson et al. | 330/297 |
| 5,442,317 A * | 8/1995 | Stengel | 330/10 |
| 5,559,467 A * | 9/1996 | Smedley | 330/10 |
| 5,610,553 A * | 3/1997 | Kirn | 330/251 |
| 5,760,637 A | 6/1998 | Wong et al. | 327/536 |
| 5,790,393 A | 8/1998 | Fotouhi | 363/60 |
| 5,831,845 A | 11/1998 | Zhou et al. | 363/60 |
| 5,832,324 A | 11/1998 | Shimizu et al. | 396/303 |
| 5,949,282 A * | 9/1999 | Nguyen et al. | 330/10 |
| 5,960,898 A | 10/1999 | Okada et al. | 180/65.8 |
| 5,973,944 A | 10/1999 | Nork | 363/60 |
| 5,978,547 A | 11/1999 | Reynolds et al. | 388/811 |
| 5,986,498 A * | 11/1999 | Rodriguez | 330/207 A |
| 6,034,443 A | 3/2000 | Oliemuller et al. | 307/70 |
| 6,049,532 A | 4/2000 | Steel et al. | 370/311 |
| 6,055,168 A | 4/2000 | Kotowski et al. | 363/60 |
| 6,064,583 A | 5/2000 | Lochner et al. | 363/62 |
| 6,081,096 A | 6/2000 | Barkat et al. | 320/124 |
| 6,097,973 A | 8/2000 | Rabe et al. | 455/572 |
| 6,140,807 A | 10/2000 | Vannatta et al. | 323/283 |
| 6,160,449 A | 12/2000 | Klomsdorf et al. | 330/149 |
| 6,166,598 A | 12/2000 | Schlueter | 330/127 |
| 6,169,673 B1 | 1/2001 | McIntyre et al. | 363/59 |
| 6,259,317 B1 * | 7/2001 | Melanson | 330/10 |
| 6,297,697 B2 * | 10/2001 | Delano et al. | 330/207 A |

* cited by examiner

Primary Examiner—Robert Pascal
Assistant Examiner—Khanh Van Nguyen
(74) Attorney, Agent, or Firm—Testa, Hurwitz & Thibeault, LLP

(57) ABSTRACT

A system, receiving an input signal to be amplified and provided to a load. The system includes a switch, a shaper, a power source array, a power reservoir array and a controller. The switch is connected to the load and produces a switch output signal. The input signal and the switch output signal are received by the shaper, which produces a shaper output signal and applies it to the controller. The power source monitor monitors the source power levels of all power sources within power source array and applies the readings to the controller. The power reservoir monitor monitors the reservoir power levels of all power reservoirs within power reservoir array and applies the readings to the controller. The controller determines a switching scheme according to the shaper output signal and the power levels readings of all power sources with in power source array and all power reservoirs within power reservoir array. The controller commands the switch to apply the determined switching scheme on the power source array, power reservoir array and the load, which in turn produces a new switch output signal.

128 Claims, 17 Drawing Sheets

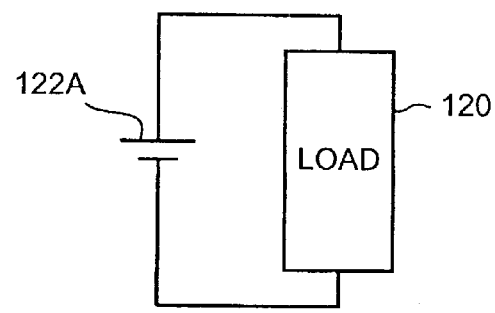
FIG. 3A
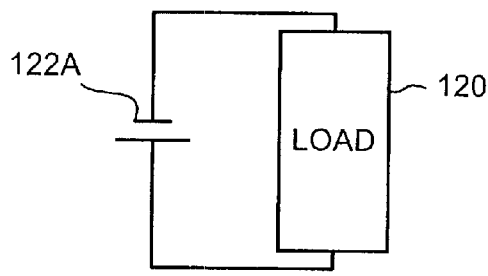
FIG. 3B
FIG. 3C
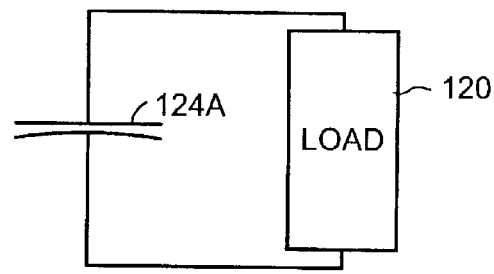
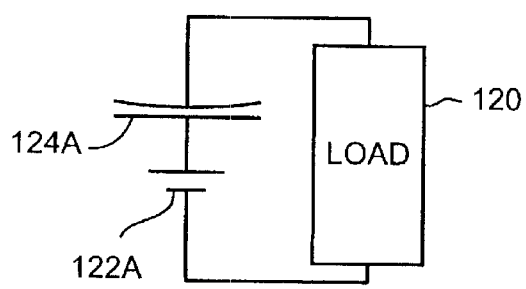
FIG. 3D

METHODS AND SYSTEMS FOR POWER AMPLIFYING OF SIGNALS

FIELD OF THE INVENTION

The disclosed technique relates to methods and systems for power amplifying of signals in general, and to methods and systems for power amplifying of audio signals, in particular.

BACKGROUND OF THE INVENTION

Methods and systems for amplifying electrical signals are known in the art. In general, electrical power amplifiers receive a data signal (digital or analog) and produce a respective power amplified analog signal. The type of input signal and the limitations, which are imposed on the output signal, define the structure of the power amplifier and the method, which is used for operating it. Power amplifiers are divided into several classes, according to their structure, such as class A, class AB, class D, and the like.

Conventional power-pushing elements, such as transistors (e.g., BJT, MOSFET, and the like) are made of semiconductor materials. Such power-pushing elements are characterized by a minimal operative voltage (i.e., N-type) or a maximal operative voltage (i.e., P-type). It is noted that in a given configuration, such a power-pushing element is operative to either push current or pull current (i.e., the power-pushing element can deliver current only in one direction).

The type of each of these power-pushing elements inherently limits the voltage levels, which can be amplified thereby. For example, a BJT NPN power-pushing element is characterized by a minimal operative voltage of about 0.7 volts, while defining the input signal as the voltage between the base terminal and the emitter terminal. Accordingly, a BJT NPN power-pushing element can amplify input signals, which are higher than this minimal operative voltage level. It is noted that such a power-pushing element is further limited by a maximal input voltage level, above which it saturates. Most power-pushing elements are also characterized by non-linear transfer functions.

Reference is now made to FIG. 1A, which is a schematic illustration of a class A power amplifier, generally referenced 10, which is known in the art. Class A power amplifier utilizes a single power-pushing element, which pushes current in one direction only, thereby producing only unipolar output signals. For that purpose, class A architecture converts the input signal to a unipolar signal, by shifting it completely either above or below zero level. Class A architecture includes a control unit which overcomes the minimal operative voltage problem and the inherent non-linearity of the power-pushing element.

Amplifier 10 includes a summing unit 2, a controller 4 and a power-pusher 6. Summing unit 2 is connected to a constant bias source $V_{BIAS}$, referenced 8 and to controller 4. Controller 4 is further connected to power-pusher 6. Summing unit 2 receives an input signal X(t), adds $V_{BIAS}$ 8, and provides the result (i.e., X(t)+$V_{BIAS}$) to controller 4. Controller 4 produces a respective control signal and provides it to power-pusher 6. Power-pusher 6 produces a power amplified signal Y(t) and provides it back to controller 4, as feedback. Controller 4 compares the output Y(t) with the elevated input (i.e., X(t)+$V_{BIAS}$) and updates the control signal, so as to correct any errors found between the compared signals.

In general, a class A power amplifier has an output signal with a defined polarity, either positive or negative, according to the type and connectivity of the power-pushing element, which is used therefore. A class A power amplifier is characterized by high quality power amplification in terms of error between the elevated input signal and the output signal.

It is noted that the output of a class A power amplifier is biased. Hence, such a power amplifier can be implemented in systems, which are not sensitive to DC signals, such as audio systems.

The theoretical efficiency of a class A power amplifier, for a full-scale sine shaped signal is 25%. The theoretical efficiency for a full-scale typical speech or audio signal is about 8%. In class A power amplifiers, power is wasted in the form of heat. The power is mainly wasted across the power-pusher, due to the difference between the supplied power source voltage and the output voltage applied to the load.

Class AB power amplifier architecture is a bipolar power amplifier. Class AB architecture includes two power-pushing elements, one for amplifying the positive portion of the input signal and the other for amplifying the negative portion of the input signal.

Reference is now made to FIG. 1B, which is a schematic illustration of a class AB power amplifier, generally referenced 20, which is known in the art. Amplifier 20 includes a controller 22, a bias power system 24 and two power-pushers 26 and 28. Bias power system 24 is connected to controller 22, to the input terminal of positive power-pusher 26 and to the input terminal of negative power-pusher 28. The output terminals of power-pushers 26 and 28 are connected there between and further to controller 22.

In the example set forth in FIG. 1B, positive power-pusher 26 incorporates a positive power-pushing element (e.g., N-MOSFET, NPN, and the like) and negative power-pusher 28 incorporates a negative power-pushing element (e.g., P-MOSFET, PNP, and the like).

Each of the semiconductor elements used for power-pushers 26 and 28, exhibits a minimal operative voltage $V_1 > 0$ and a maximal operative voltage $V_2 < 0$, respectively. Together, $V_1$ and $V_2$ define a conductance dead zone from $V_2$ to $V_1$. Class AB power amplifier does not allow both power-pushers to operate in the conductance dead zone. In such a situation, both power-pushers do not conduct and hence, the output signal is not defined. Accordingly, bias power system 24 always sets at least one of the power-pushers to conduct current, thereby producing a defined output signal.

Controller 22 receives an input signal X(t), produces a respective control signal and provides it to bias power system 24. Bias power system 24 modifies the control signal according to the dead zone defined by power-pushers 26 and 28 and provides a positively biased version of the control signal to positive power-pusher 26 and a negatively biased version of the control signal to negative power-pusher 28. Positive power-pusher 26 produces an output signal $Y_1(t)$, according to the positively biased control signal provided thereto. Negative power-pusher 28 produces an output signal $Y_2(t)$, according to the negatively biased control signal provided thereto. The output terminals of power-pushers 26 and 28 are short circuited together to form a common output terminal, producing an output signal Y(t). The output currents of both power-pushers 26 and 28 are summed, thus defining the output signal to be $Y(t)=Y_1(t)+Y_2(t)$. Y(t) is fed back to controller 22. Controller 22 compares the output Y(t) with the input signal X(t) and updates the control signal, so as to correct any errors found between the compared signals.

A class AB architecture, compared with the class A architecture, exhibits lower quality and higher efficiency. The theoretical efficiency of a class AB power amplifier, for a full-scale sine shaped signal is 78.5%. The theoretical efficiency for a full-scale typical speech or audio signal is about 30%. In class AB power amplifiers, power is wasted in the form of heat. The power is mainly wasted across the power-pushers, due to the difference between the supplied power sources voltages and the output voltage applied to the load.

Power amplifying architecture is often influenced by the implementation thereof. For example, class D architecture is directed at situations where either the load is adapted to operate in a limited frequency bandwidth or the receiver of the produced output signal is sensitive to a limited frequency bandwidth. The frequency bandwidth of interest is defined as the cross-section between the load limited frequency bandwidth and the receiver limited frequency bandwidth. Hence, the output signal, provided to the load, can include frequencies beyond the frequency bandwidth of interest, which are discarded or ignored, according to the nature of the load and the receiver. For example, in an audio system, the speaker defines the load and the human ear defines the receiver. According to another example, in a mechanical motorized system, an electrical motor defines the load and the mechanical assembly attached thereto defines the receiver.

Reference is now made to FIG. 1C, which is a schematic illustration of a class D power amplifier, generally referenced 30, which is known in the art. Amplifier 30 includes a shaper 32 and an N-level power quantizer 34 connected thereto. N-level power quantizer 34 is operative to select from a finite set of N predetermined output voltage levels.

Shaper 32 receives an input signal X(t), produces a respective desired output signal and provides it to N-level power quantizer 34. In turn, N-level power quantizer 34 selects from the finite set of voltage levels, a voltage level, which is closest to the desired output signal and provides it as an output signal. The output signal is fed back to shaper 32, which in turn updates the desired output signal.

The input signal is usually an analog signal or a high-resolution digital signal (i.e., a digital signal comprises a large number of digitally represented analog levels). The output signal, being comprised of N (small finite number) voltage levels, is not identical to the desired output signal. The difference between the output signal and the desired output signal is defined as noise. The desired output signal is updated so as to shift the noise outside the limited frequency bandwidth of interest, while keeping the portion of the output signal, which is within the limited frequency bandwidth of interest, as close as possible to the input signal.

One specific group of class D power amplifiers is called 1-bit power amplifiers. 1-bit power amplifiers produce only two levels of output voltage, wherein one level is defined zero and the other level is the voltage level feeding the power amplifier.

Reference is now made to FIGS. 1D and 1E, which are examples of a typical output signal of a class D power amplifier utilizing a 4-level power quantizer, for two different constant input signals (referenced $V_{IN}$). Each output voltage level is selected to be applied to the output, during a time period T, wherein at the end of that time period, a new output voltage level is selected. It is noted that the new output voltage level can be identical to the former one. Time period T defines the operating frequency F of the N-level power quantizer 34, wherein F=1/T. According to class D theory, the operating frequency F should be significantly higher than the maximal frequency in the frequency bandwidth of interest. FIG. 1D illustrates an output signal, which is respective of a relatively high input signal. FIG. 1E illustrates an output signal, which is respective of a relatively low input signal.

The theoretical efficiency of a class D (1-bit) power amplifier for a full-scale sine shaped signal is about 83%. The theoretical efficiency for a full-scale typical speech or audio signal is about 47%. The power loss in a class D power amplifier resides in portions of the output signal, which are external to the frequency bandwidth of interest. For example, a class D audio power amplifier usually has a frequency bandwidth of interest of 20 Hz–20 KHz. The respective class D output signal includes a portion located between 20 Hz and 20 KHz which consumes about 47% of the total consumed power. The other portion of the output signal is located above 20 KHz, regarded as noise and consumes all the rest of the power (i.e., about 53%).

It is customary to regard class A and class AB power amplifiers as time domain power amplifiers and class D power amplifiers as frequency domain power amplifiers. A class A or class AB power amplifier produces an output signal which is substantially identical in shape (up to DC bias at class A power amplifiers) to the input signal. A class D power amplifier produces an output signal, which is constructed of a discrete set of voltage levels (i.e., even two voltage levels are enough). These discrete voltage levels are applied to the load element, for constant periods of time. Hence, the shape of the output signal is not identical to that of the input signal. A class D power amplifier substantially duplicates the frequency bandwidth of interest of the input signal to the output signal, while shaping the noise outside these frequencies.

The above-disclosed architectures suffer from low power amplification efficiency. Other architectures, which are known in the art, attempt to overcome this disadvantage.

One type of such architectures utilizes a plurality of power sources and a time domain power amplifier, also referred to as class G power amplifiers. Reference is now made to FIG. 1F, which is a schematic illustration of a power amplifier having multiple power sources, generally referenced 40, which is known in the art. Amplifier 40 includes a controller 42, a power source monitor 44, a power source array 46 and a time domain power amplifier 48. Controller 42 is connected to power source monitor 44 and to power source array 46. Power source array 46 is further connected to time domain power amplifier 48 and to power source monitor 44.

Controller 42 and time domain power amplifier 48 receive an input signal X(t). Power source monitor 44 measures the voltage levels of all the power sources of power source array 46 and provides the respective readings to controller 42. Controller 42 approximates a desired output signal according to the input signal and selects a power source from power source array 46, according to the desired output signal. The selected power source exhibits the lowest voltage level (out of the voltage levels available in power source array 46), which is higher than the desired output signal. Controller 42 connects the selected power source to time domain power amplifier 48, which in turn produces the desired output signal according to the input signal X(t). It is noted that loss of power in time domain amplifier architectures such as class A and class AB, mainly resides in the difference between the supplied power source voltage and the output voltage applied to the load. This architecture reduces this difference by selecting a power source having a voltage, which is closest to the output voltage applied to the load, thereby reducing power loss.

Examples of this kind of architecture are shown in U.S. Pat. No. 4,598,255 to Hong, entitled "Power Amplifier Apparatus", in U.S. Pat. No. 3,961,280 to Sampei, entitled "Amplifier Circuit Having Power Supply Voltage Responsive to Amplitude of Input Signal" and in U.S. Pat. No. 3,772,606 to Waehner, entitled "Multi-Level Power Amplifier".

Another type of such architectures utilizes a single power source coupled with a voltage tracker and a time domain power amplifier, also referred to as class H power amplifiers. Reference is now made to FIG. 1G, which is a schematic illustration of a voltage tracking power amplifier, generally referenced 50, which is known in the art. Amplifier 50 includes a power source 52, a voltage tracker 54 and a time domain power amplifier 56. Voltage tracker 54 is connected to power source 52 and to time domain power amplifier 56.

Voltage tracker 54 and time domain power amplifier 56 receive an input signal X(t). Voltage tracker 54 approximates the desired output signal according to the input signal. Voltage tracker 54 efficiently reduces the voltage level, provided by power source 52, to a level, which is a little higher than the voltage of the desired output signal, thereby reducing power loss. Voltage tracker 54 provides the reduced voltage level to time domain power amplifier 56, which in turn produces the desired output signal according to the input signal X(t). It is noted that the reduction in power loss mainly depends on the efficiency of voltage tracker 54 and its ability to track the desired output signal.

Examples for this kind of architecture are shown in U.S. Pat. No. 4,218,660 to Carver, entitled "Audio Amplifier and Method for Apparatus", in U.S. Pat. No. 5,396,194 to Williamson et al., entitled "Audio Frequency Power Amplifiers" and in U.S. Pat. No. 5,101,172 to Ikeda et al., entitled "Linear Amplifier".

A further type of such architectures utilizes a frequency domain power amplifier, which is coupled at the output thereof to a passive reactive low-pass filter, also referred to as improved class D power amplifiers. Reference is now made to FIG. 1H, which is a schematic illustration of a filtered frequency domain power amplifier, generally referenced 60, which is known in the art. Amplifier 60 includes a frequency domain power amplifier 62, a passive reactive low-pass filter 64 and a power source 66. Frequency domain power amplifier 62 is connected to passive reactive low-pass filter 64 and to power source 66. Frequency domain power amplifier 62 produces a class D type output signal, which includes a portion residing within the frequency bandwidth of interest and another portion, defined as noise, residing outside the frequency bandwidth of interest. Passive reactive low-pass filter 64 is tuned so as to allow only the portion of the class D type output signal, which resides in the frequency bandwidth of interest, to pass there through. Passive reactive low-pass filter 64 returns the energy of the noise portion of the output signal, back to frequency domain power amplifier 62. Theoretically, passive reactive low-pass filter 64 serves as a power reservoir, which collects most of the power of the noise and thus serves as a secondary power source to the frequency domain power amplifier 62. This architecture reduces power loss by storing the energy of the noise in the reactive elements of passive reactive low-pass filter 64 and returning this energy back to the system. An Example of this kind of architecture is shown in U.S. Pat. No. 4,178,556 to Attwood, entitled "Class D Amplifier System".

Systems for controlling power supply output signals, using capacitors as temporary power sources, are known in the art. Conventional switched power supplies, DC to DC converters and AC to DC converters, which are known in the art, use capacitors as controlled temporary power sources, by connecting the capacitors either in series, parallel or mixed architecture, to the load. Examples for such devices are shown in U.S. Pat. No. 5,960,898 to Okada et al., entitled "Power Supply Unit and Electric Vehicle Incorporating the Same" and in JP Patent application No. 11-052411 to Okamura et al., entitled "Switching Connection Control Capacitor Power Supply".

Other applications, use capacitor switching for reducing the effective resistance of a constant power source, by switching a capacitor in parallel to the power source, when required. An example of such architecture is shown in U.S. Pat. No. 6,097,973 to Rabe et al, entitled "Electronic Circuit for a Portable Electronic Device".

SUMMARY OF THE DISCLOSED TECHNIQUE

It is an object of the disclosed technique to provide a novel method and system for amplifying an input signal which overcome the disadvantages of the prior art.

In accordance with the disclosed technique, there is thus provided an amplifier, receiving an input signal to be amplified and provided to a respective load element. The amplifier includes a switch, a shaper, a power source array, a power reservoir array and a controller. The switch is connected to the load element. The power source array and the power reservoir array are connected to the switch. The controller is connected to the shaper and to the switch. The power source array includes at least one power source and the power reservoir array includes at least one power reservoir.

The switch produces a respective switch output signal for each the input signals. The shaper determines a respective shaper output signal, for each of the input signals, according to the input signal and a respective switch output signal. The controller determines a switching scheme according to the shaper output signals. The switch applies the switching scheme to the load element, to the power source array and to the power reservoir array.

In accordance with another aspect of the disclosed technique, there is thus provided an amplifier, receiving an input signal to be amplified and provided to a load element. The amplifier includes an active load, a switch connected to the active load, a shaper, a power source array, a power reservoir array, and a controller. The power source array is connected to the switch. The power source array includes at least one power source. The power reservoir array is connected to the switch. The controller is connected to the shaper and to the switch.

The active load provides an active load output signal to the load element. The shaper determines a shaper output signal, according to the input signal and the active load output signal. The controller determines a switching scheme, according to the shaper output signal. The switch applies the switching scheme to the power source array, to the power reservoir array and further to the active load. The active impedance of the active load is determined according to the system signals provided by the system.

In accordance with a further aspect of the disclosed technique, there is thus provided an amplifier, receiving an input signal to be amplified and provided to a respective load element. The amplifier includes a switch, a shaper, a power source array, a power reservoir array, an active load array and a controller. The switch is connected to the load element.

The power source array and the power reservoir array are connected to the switch. The active load array is connected to the switch. The controller is connected to the shaper and to the switch.

The switch produces a respective switch output signal for each the input signals. The shaper determines a respective shaper output signal, for each the input signals, according to the input signal and a respective switch output signal. The active load array includes at least one active load element. The controller determines a switching scheme according to the shaper output signal. The switch applies the switching scheme to the load element, to the power source array and to the power reservoir array. The active impedance of selected ones of the active elements is determined according to system signals provided by the system.

In accordance with another aspect of the disclosed technique, there is thus provided a method for amplifying an input signal and providing the amplified input signal to a respective load element. The method includes the steps of analyzing each of the input signals and the respective feedback signal, determining a switching scheme for a subsequent best output signal, and applying the switching scheme to the load element.

The subsequent best output signal is determined by analyzing each of the input signals and the respective feedback signal. The respective subsequent best output signal is applied to the respective load element.

BRIEF DESCRIPTION OF THE DRAWINGS

The disclosed technique will be understood and appreciated more fully from the following detailed description taken in conjunction with the drawings in which:

FIGS. 3A, 3B, 3C, 3D, 3E, 3F and 3G are schematic illustrations of switching schemes for the switch of FIG. 2A, according to other preferred embodiments of the disclosed technique;

FIG. 9 is an illustration of a method for operating the system of

FIG. 7, operative in accordance with another preferred embodiment of the invention;

DETAILED DESCRIPTION OF PREFERRED EMBODIMENTS

The disclosed technique overcomes the disadvantages of the prior art by providing a novel power amplification architecture with power reservoirs and power sources, which charge the power reservoirs through the load. According to the disclosed technique, unused power is stored in temporary power reservoirs, which are then used as additional power sources, wherein the management of the entire architecture is based on principles, similar to those of class D architecture.

In general, the disclosed technique switches a plurality of power sources and a plurality of temporary power reservoirs to produce a finite set of output voltage levels, across a general load element. According to another aspect of the invention, an active load element is coupled in series to the general load element, thereby extending the finite set of output voltage levels to a continuous range and thus increasing efficiency. According to a further aspect of the invention, the architecture is connected to a plurality of general load elements and a plurality of active load elements for increased efficiency over the plurality of load elements.

Figure 1A:
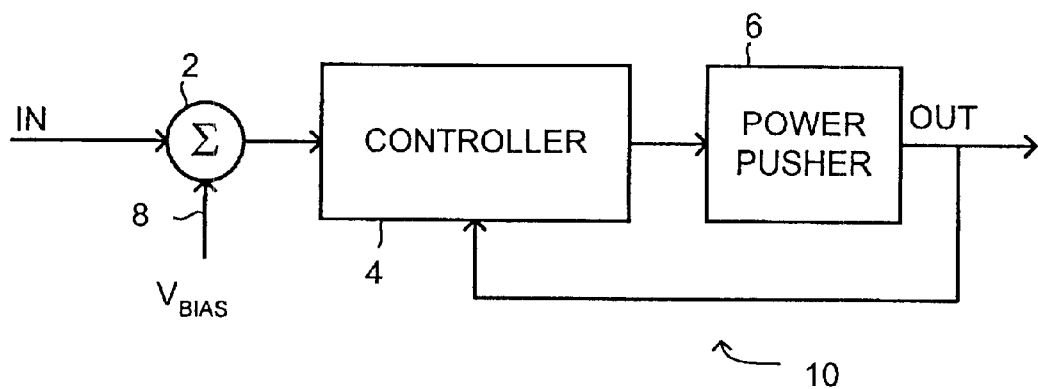
FIG. 1A is a schematic illustration of a class A power amplifier which is known in the art.
Figure 1B:
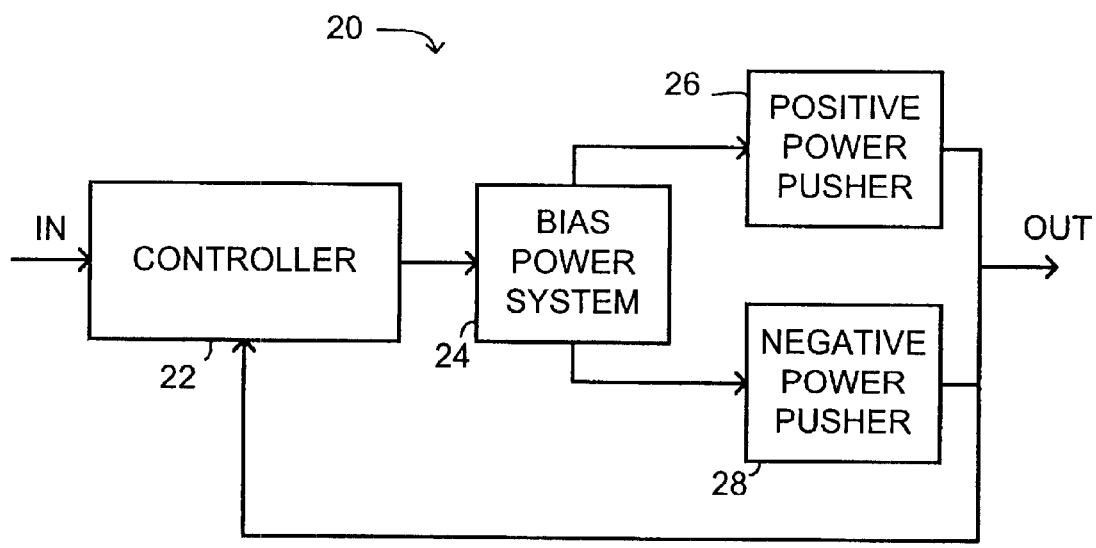
FIG. 1B is a schematic illustration of a class AB power amplifier which is known in the art.
Figure 1C:
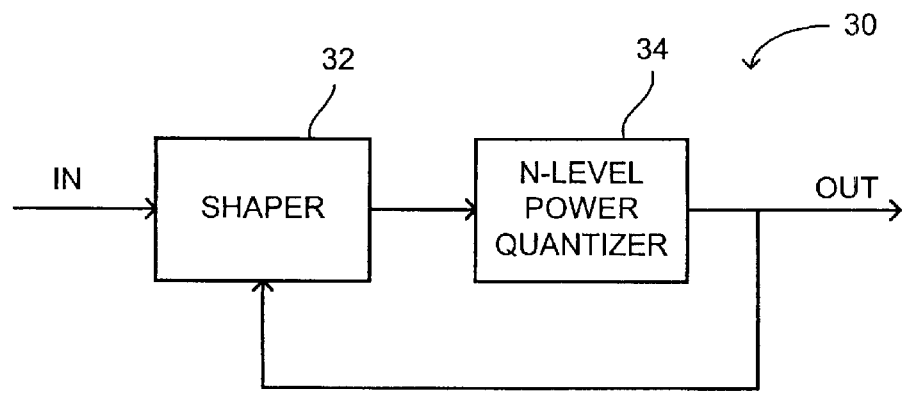
FIG. 1C is a schematic illustration of a class D power amplifier which is known in the art.
Figure 1D:
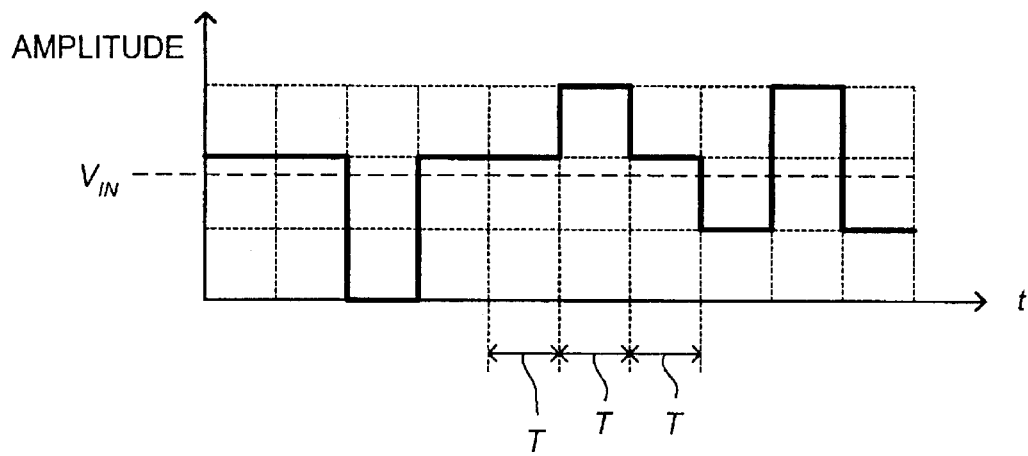
FIGS. 1D and 1E are examples of a typical output signal of a class D power amplifier utilizing a 4-level power quantizer, for two different constant input signals.
Figure 1E:
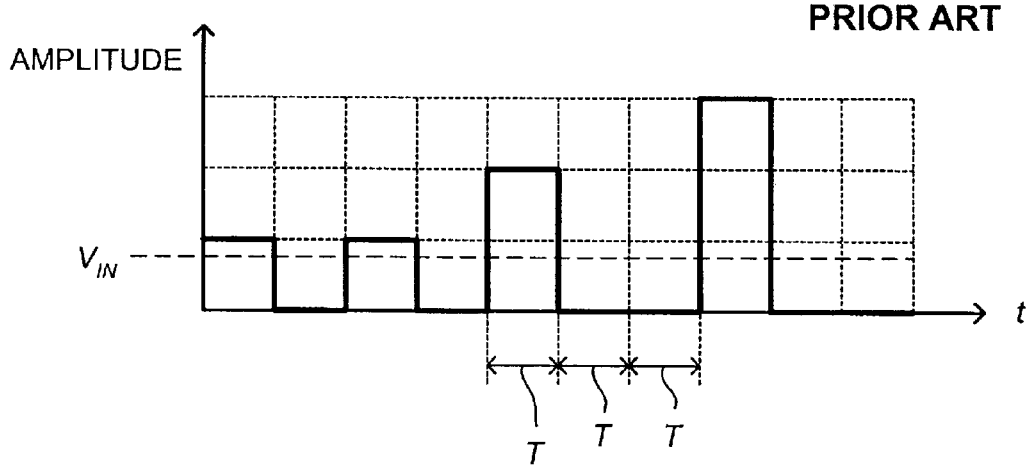
Figure 1F:
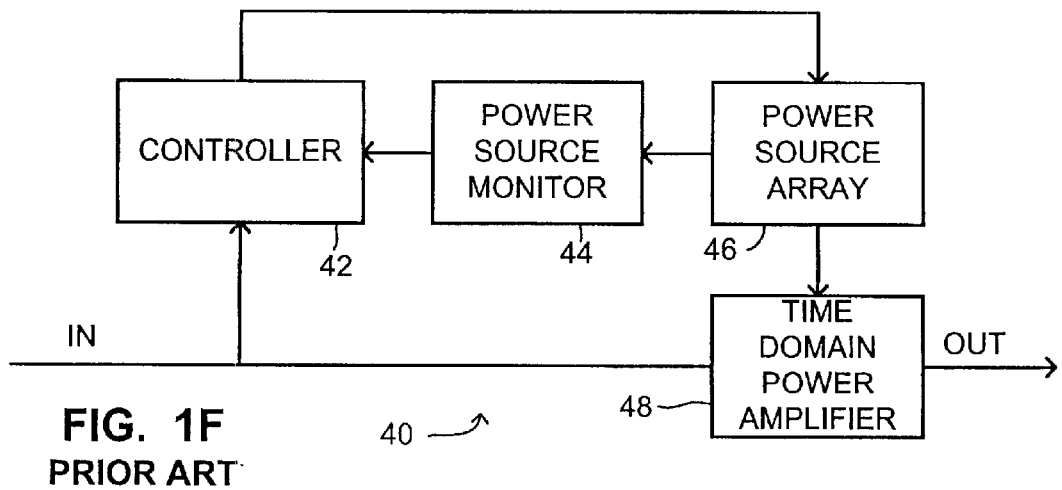
FIG. 1F is a schematic illustration of a power amplifier having multiple power sources which is known in the art.
Figure 1G:
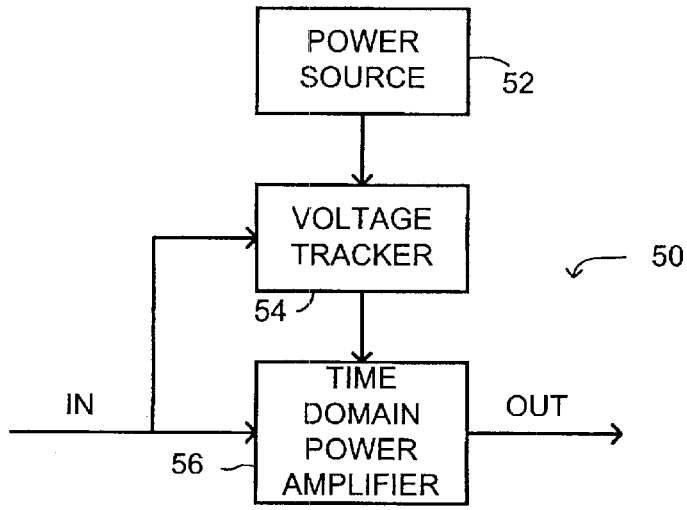
FIG. 1G is a schematic illustration of a voltage tracking power amplifier which is known in the art.
Figure 1H:
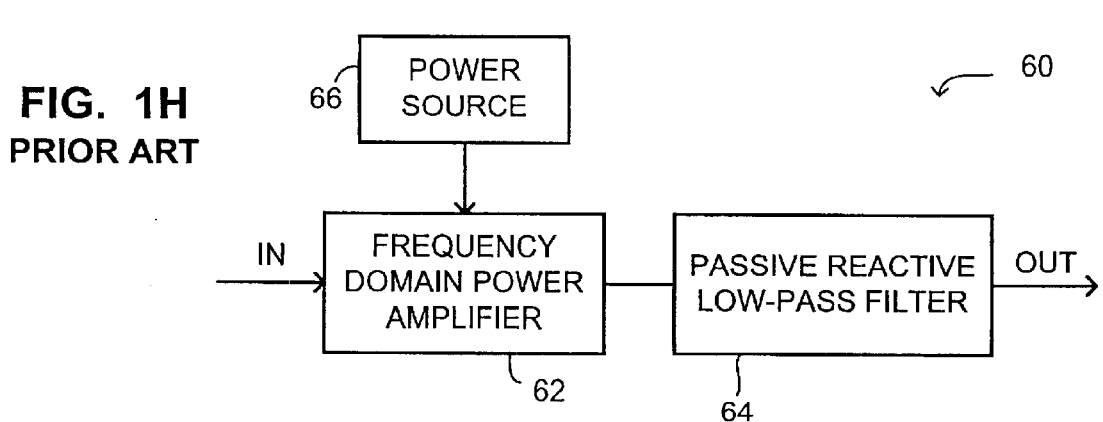
FIG. 1H is a schematic illustration of a filtered frequency domain power amplifier which is known in the art.
Figure 2A:
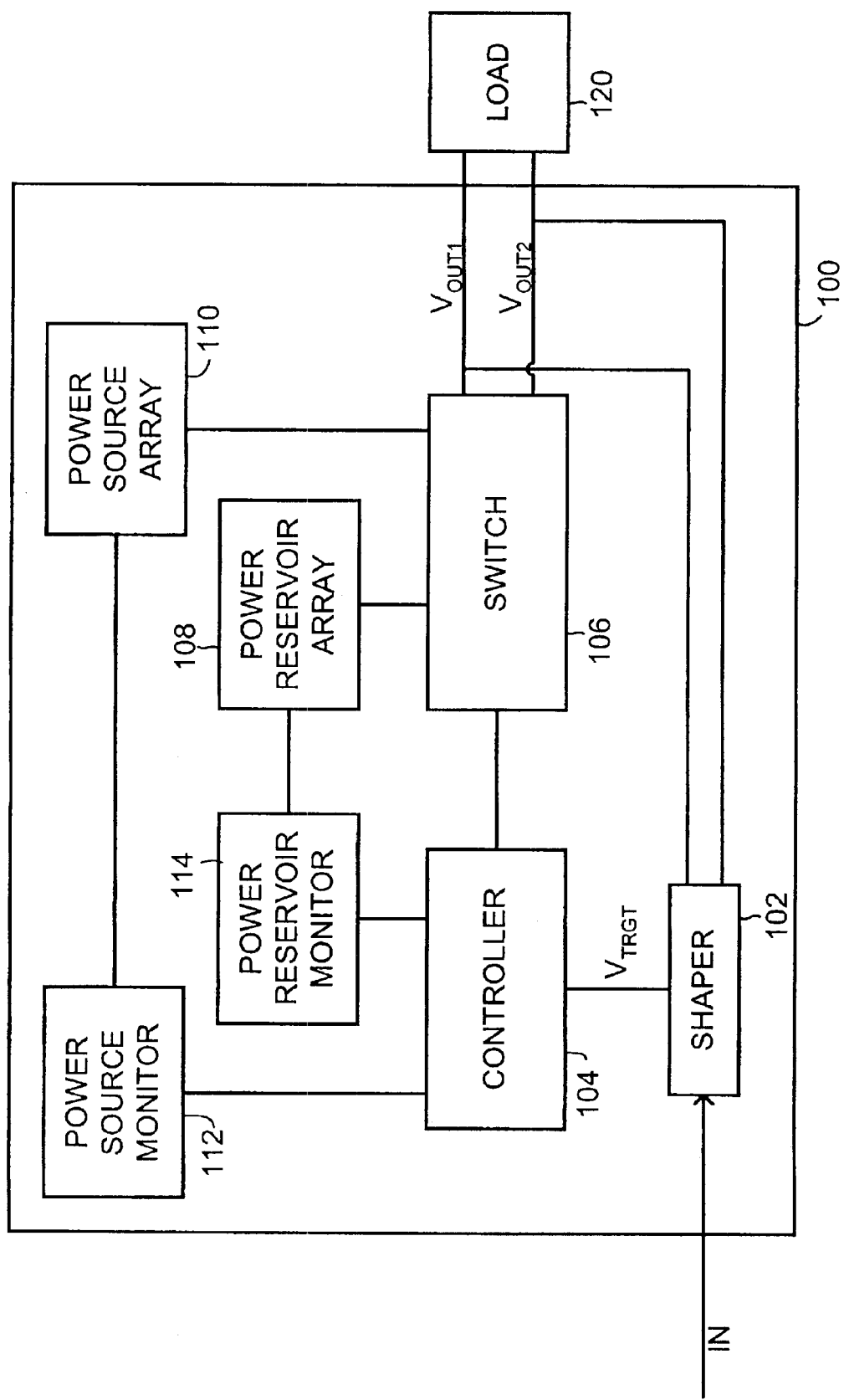
FIG. 2A is a schematic illustration of a power amplifier, constructed and operative in accordance with a preferred embodiment of the disclosed technique.

Reference is now made to FIG. 2A, which is a schematic illustration of a power amplifier, generally referenced 100, constructed and operative in accordance with a preferred embodiment of the disclosed technique. Power amplifier 100 includes a shaper 102, a controller 104, a switch 106, a power reservoir array 108, a power source array 110, a power reservoir monitor 114 and a power source monitor 112.

Power reservoir array 108 includes a plurality of passive power reservoir elements such as capacitors or inductors (coils), and the like, or a combination thereof. It is noted that capacitors, which are included in power reservoir array 108, may be floating or constantly connected at one end to a predetermined power source.

Power source array 110 includes a plurality of active power elements such as a battery, a power source unit, doubling voltage circuitry, and the like, or a combination thereof. It is noted that the power sources of power source array 110 are not necessarily stable or unipolar. These power sources can be selected from a wide selection of power sources, which provide electrical power at their output, such as chemical to electrical sources (e.g., battery, gasoline generator, and the like), physical to electrical sources (e.g., river dynamo, vehicle dynamo, hand dynamo, and the like), radiation to electrical sources (e.g., solar cells, and the like), heat to electrical sources (e.g., steam generator, and the like) and electrical to electrical sources (AC power supply units, DC power supply units, double voltage circuit, triple voltage circuits, and the like).

Shaper 102 is connected to controller 104 and to the output terminals of switch 106. Controller 104 is further connected to switch 106. Power reservoir monitor 114 is connected to controller 104 and to power reservoir array 108. Power source monitor 112 is connected to controller 104 and to power source array 110. Power reservoir array 108 and power source array 110 are further connected to switch 106. The output terminals of switch 106 define the output terminals of power amplifier 100, to be further connected to load element 120. These output terminals provide an output signal $V_{OUT}=V_{OUT1}-V_{OUT2}$.

Shaper 102 receives an input signal from an input source (not shown) and a feedback signal $V_{OUT}$ from the output terminals of switch 106. It is noted that $V_{OUT2}$ may be coupled to the reference voltage of the entire system and hence $V_{OUT}=V_{OUT1}$. Accordingly, the output of switch 106, $V_{OUT}$, can be represented by a single terminal (mono connection).

It is noted that shaper 102 can perform preliminary operations on $V_{OUT}$ before analyzing it. An example of such an operation is given in an architecture, which is designed so as to achieve a predetermined function F, from input to output. Accordingly, shaper 102 applies an inverse function $F^{-1}$ on $V_{OUT}$, before analyzing it. A private case of this example is given in an architecture, which is designed so as to achieve a gain G from input to output. Accordingly, shaper 102 applies an inverse gain function $G^{-1}$ on $V_{OUT}$, before analyzing it.

Shaper 102 analyzes the feedback signal $V_{OUT}$ with respect to the input signal and produces a subsequent best output signal $V_{TRGT}$. Theoretically, that subsequent best output signal $V_{TRGT}$ should be applied to load element 120. Different shapers yield different subsequent best output signals, according to their structures and settings. The term "best" used throughout the disclosure refers to an optimum according to a selected shaper structure and shaper parameters. It is noted that an approximation of the theoretical subsequent best output signal, may be sufficient in most cases, as a substitute for the subsequent best output signal. Shaper 102 provides that subsequent best output signal $V_{TRGT}$ to controller 104.

Alternatively, shaper 102 can produce a signal which can be regarded as a function (i.e., invertible or non-invertible function) of subsequent best output signal $V_{TRGT}$. It is noted that this signal is not necessarily calculated from $V_{TRGT}$. When controller 104 receives such a signal from shaper 102, it performs preliminary operations thereon, according to the nature of that signal, in order to restore a subsequent best output signal $V_{TRGT}$.

According to one aspect of the disclosed technique, the signal received from shaper 102 is an invertible function F (i.e., function F has a respective inverse function $F^{-1}$) of the subsequent best output signal $V_{TRGT}$. Accordingly, controller 104 applies the respective inverse function $F^{-1}$ to that signal, thereby converting it to the actual subsequent best output signal $V_{TRGT}$. For example, shaper 102 and controller 104 can correlate there between, by incorporating two inverse functions such as EXP and LOG. Hence, shaper 102 provides $EXP(V_{TRGT})$ to controller 104, which in turn converts it back to $V_{TRGT}$ by applying LOG, wherein $LOG(EXP(V_{TRGT}))=V_{TRGT}$.

According to another aspect of the disclosed technique, the signal, received from shaper 102, can be a non-invertible function F (i.e., function F does not have a respective inverse function $F^{-1}$) of the subsequent best output signal $V_{TRGT}$. F is characterized so that the subsequent best output signal $V_{TRGT}$ can still be restored therefrom, by introducing additional data to the restoration process. For example, shaper 102 provides the absolute value of $V_{TRGT}$ (i.e., $|V_{TRGT}|$) to controller 104. In turn, controller 104 determines an approximation of the sign of $V_{TRGT}$ (i.e., $sign(V_{TRGT})$), from the input signal. Finally, controller 104 restores $V_{TRGT}$ by multiplying $sign(V_{TRGT})$ by $|V_{TRGT}|$, thus yielding: $sign(V_{TRGT}) \cdot |V_{TRGT}|=V_{TRGT}$. It is noted that in such a configuration, controller 104 should receive the input signal (additional data) as well.

Power source monitor 112 monitors the available power levels, which are currently available by power source array 110 and provides this information to controller 104. Power source monitor 112 can be made redundant when all of the power levels of the power sources are known or can be estimated at all times (e.g., when power levels are known constant DC).

Power reservoir monitor 114 monitors the available power levels, which are currently available by power reservoir array 108 and provides this information to controller 104. Power reservoir monitor 114 can be made redundant, if all power levels of all power reservoirs can be estimated at all times (e.g., setting initial power levels to all power reservoirs and extrapolating the changes of those power levels, according to the switching schemes).

Controller 104 selects the most suitable combination of power sources and power reservoirs, according to the subsequent best output signal $V_{TRGT}$ and determines a respective switching scheme. The switching scheme determines the way of coupling the selected power sources and power reservoirs there between and further to the load, as shall be described further below. Controller 104 provides the switching scheme to switch 106. Switch 106 applies the switching scheme to the selected power reservoirs of power reservoir array 108, to the selected power sources of power source array 110 and further to load 120.

The result of applying the switching scheme with the selected power sources and power reservoirs on the load, yields a power level. This power level is essentially an approximation, under certain restrictions and limitations, of the subsequent best output signal $V_{TRGT}$, using the selected power sources and power reservoirs. As stated above, shaper 102 detects the power level at the output of switch 106 and utilizes it to determine the subsequent best output signal $V_{TRGT}$.

Figure 2B:
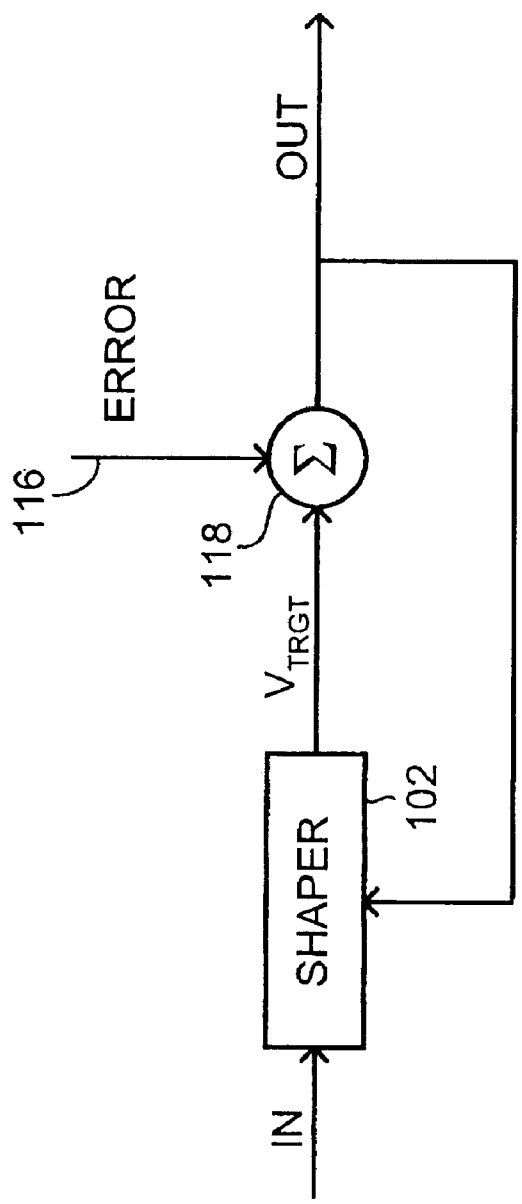
FIG. 2B is a schematic illustration of linear model of system 100 of FIG. 2A, according to another preferred embodiment of the disclosed technique.

The following, is a simplified explanation of a method for operating shaper 102, according to one preferred embodiment of the disclosed technique. Reference is further made to FIG. 2B, which is a schematic illustration of linear model of system 100 of FIG. 2A, according to another preferred embodiment of the disclosed technique. It is noted that other models can be selected for system 100.

According to the model illustrated in FIG. 2B, a combination of a summing element 118 and an error input 116 represents system 100, excluding shaper 102. Shaper 102 is connected to the input of summing element 118 and to the output thereof. Shaper 102 receives an input signal X(t) and provides the subsequent best output signal $V_{TRGT}$ to summing element 118. Shaper 102 receives the output signal of summing element 118 as feedback. Error input 116 denotes the difference between the subsequent best output signal $V_{TRGT}$ and the actual output signal.

In the following example, shaper 102 is defined to be linear. Let X(s) be the Laplace transform of the input signal, let E(s) be the Laplace transform of error 116 and let Y(s) be the Laplace transform of the output signal. Assuming X(s), E(s), Y(s) exist, we define a pair of transfer functions $H_E$ and $H_X$, which describe the behavior of the linear model of system 100.

$$H_E(s) = \left.\frac{Y(s)}{E(s)}\right|_{X(s)=0} \qquad H_X(s) = \left.\frac{Y(s)}{X(s)}\right|_{E(s)=0}$$

Let B be the frequency bandwidth of interest. Theoretically, shaper 102 should stand two requirements:

$H_X(j2\pi f)=G \;\forall f \in B$, wherein $G \in \Re$ denotes the desired gain.

$H_E(j2\pi f)=0 \;\forall f \in B$

Practically these demands are impossible to achieve and thus the practical requirements from shaper 102 are usually of the form:

$H_X(j2\pi f)=T(f) \;\forall f \in B$, wherein T: $\Re \to C$ approximates the desired gain.

$|H_E(j2\pi f)|<E(f) \;\forall f \in B$, wherein E: $\Re \to \Re$ is the allowed level of noise.

Functions T and E define the quality of the system.

It is noted that the shaper parameters may be adapted according to the changing nature of the input signal, either externally, or by the shaper itself.

Controller 104 can be operated according to a plurality of methods. Each method is related to the environmental conditions regarding the nature of the power sources of power source array 110, the nature of the power reservoirs of power reservoir array 108, the architecture of the switch 106 and the nature of the load 120.

The following is an example of a method for operating controller 104, using a single power source denoted ($V_{DD}$, $V_{SS}$) and a plurality (N) of floating capacitors $C_1 \div C_N$. The term floating denotes that neither of the capacitors is hardwire restricted to a power source. In order to simplify the explanation, $V_{SS}$ is defined to be zero. It is however noted that $V_{SS}$ can be defined to be any desirable value.

1. Each of the capacitors $C_n$ can either be floating or connected so that one leg of the capacitor is coupled to one leg of the load and the other leg of the capacitor is coupled either to the other leg of the load or to power source ($V_{DD}$ or $V_{SS}$).
2. One leg of the load is coupled either to a leg of a capacitor or to a power source ($V_{DD}$ or $V_{SS}$). The other leg of the load is coupled either to a leg of a capacitor, to a power source ($V_{DD}$ or $V_{SS}$) or both to a leg of a capacitor or to a power source ($V_{DD}$ or $V_{SS}$).
3. Let $R=V_{DD}/(2N+1)$ and let $k \in (0,1]$. $\forall n \in \{1,2,\ldots\}$, capacitor $C_n$ is allowed to be charged, as long as $V(C_n) < (2n+k)R$, where $V(C_n)$ denotes the current voltage of capacitor $C_n$.
4. Let $R=V_{DD}/(2N+1)$ and let $k \in (0,1]$. $\forall n \in \{1,2,\ldots,N\}$, capacitor $C_n$ is allowed to be discharged, as long as $V(C_n) > (2n-k)R$, where $V(C_n)$ denotes the current voltage of capacitor $C_n$.
5. Define $V_{OUT}=V_{OUT1}-V_{OUT2}$ and $V_{TRGT}$ as the voltage level of the subsequent best output signal. According to this method, the controller selects a switching scheme, which minimizes the term $|V_{TRGT}-V_{OUT}|$, under the above restrictions 1, 2, 3 and 4.

The following is another example of a method for operating controller 104, using a single power source denoted ($V_{DD}$, $V_{SS}$) and a plurality (N) of restricted capacitors $C_1 \div C_N$. The term "restricted" denotes that one leg of each of the capacitors is hardwire restricted to one leg of the power source. Again, in order to simplify the explanation, $V_{SS}$ is defined to be zero. It is however noted that $V_{SS}$ can be defined to be any desirable value.

1. The non-restricted leg of each of the capacitors $C_n$ can be either floating or connected to one leg of the load.
2. Each leg of the load is coupled either to a leg of a capacitor or to a power source ($V_{DD}$ or $V_{SS}$).
3. Let $R=V_{DD}/(N+1)$ and let $k \in (0,\frac{1}{2}]$. $\forall n \in \{1,2,\ldots,N\}$, capacitor $C_n$ is allowed to be charged, as long as $V(C_n) < (n+k)R$, where $V(C_n)$ denotes the current voltage of capacitor $C_n$.
4. Let $R=V_{DD}/(N+1)$ and let $k \in (0,\frac{1}{2}]$. $\forall n \in \{1,2,\ldots,N\}$, capacitor $C_n$ is allowed to be discharged, as long as $V(C_n) > (n-k)R$, where $V(C_n)$ denotes the current voltage of capacitor $C_n$.
5. Define $V_{OUT}=V_{OUT1}-V_{OUT2}$ and $V_{TRGT}$ as the voltage level of the subsequent best output signal. According to this method, the controller selects a switching scheme, which minimizes the term $|V_{TRGT}-V_{OUT}|$, under the above restrictions 1, 2, 3 and 4.

Theoretically, at any moment that controller 104 determines that the current switching scheme should be replaced with a better one, it should provide that new switching scheme to switch 106. In practice, any change between switching schemes causes power loss and induces noise. Defining the switching scheme update interval to be infinitesimal, shall result in a substantial increase of the power loss and of the induced noise. According to another preferred embodiment of the invention, controller 104 provides a new switching scheme to switch 106, at spaced-apart intervals. The intervals can either be predetermined (e.g., by a system clock, and the like) or determined in real time (e.g., random triggering or by real time analyzing signals fed to the controller 104, such as signals received from power reservoir monitor 114 and providing a new switching scheme when a capacitor charges or discharges beyond a predetermined threshold).

Reference is now made to FIGS. 3A, 3B, 3C, 3D, 3E, 3F and 3G, which are schematic illustrations of switching schemes for switch 106, according to other preferred embodiments of the disclosed technique. The power sources illustrated in FIGS. 3A, 3B, 3D, 3E, 3F and 3G are selected from the power sources available in power source array 110 of FIG. 2A and are generally referenced 122. The capacitors illustrated in FIGS. 3C, 3D, 3E, 3F and 3G are selected from the power reservoirs available in power reservoir array 108 of FIG. 2A and are generally referenced 124. The directions in which each of the power reservoirs is connected, in a given switching scheme, merely denotes a momentary charging polarity. However, it is noted that certain power reservoir elements, such as electrolytic capacitors, have a predetermined polarity and cannot be inversely charged.

In FIG. 3A, the switching scheme includes a single power source 122A, which is directly connected to load 120. In FIG. 3B, the switching scheme includes power source 122A, which is inversely connected to load 120, with respect to the switching scheme of FIG. 3A.

In FIG. 3C, the switching scheme includes a single capacitor 124A, which is directly connected to load 120. Similar to the switching scheme of FIG. 3B, capacitor 124A can be inversely connected to load 120.

In FIG. 3D, the switching scheme includes power source 122A and capacitor 124A, connected in series to load 120.

In this switching scheme the polarity of capacitor 124A is inverted with respect to the polarity of power source 122A. The voltage level applied across load 120 is a subtraction of the voltage of capacitor 124A from the voltage of power source 122A.

Figure 3E:
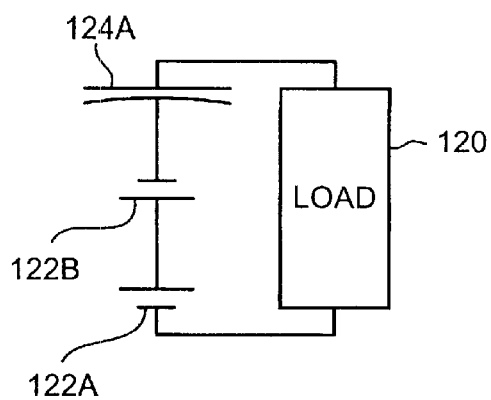

In FIG. 3E, the switching scheme includes two power sources 122A and 122B and a capacitor 124A, connected in series to load 120. In this switching scheme the polarity of power source 122B is inverted with respect to the polarity of capacitor 124A and of power source 122A. The voltage level applied on load 120 is a subtraction of the voltage of power source 122B from the sum of the voltages of capacitor 124A and of power source 122A.

Figure 3F:
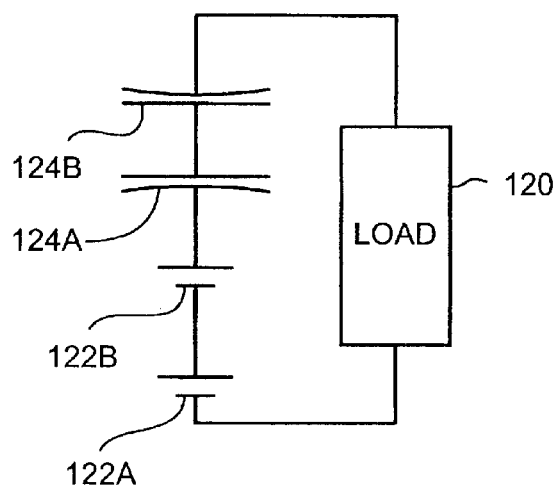

In FIG. 3F, the switching scheme includes two power sources 122A and 122B and two capacitor 124A and 124B, connected in series to load 120. In this switching scheme the polarity of capacitor 124B is inverted with respect to the polarity of capacitor 124A and of power sources 122A and 122B. The voltage level applied on load 120 is a subtraction of the voltage of capacitor 124B from the sum of the voltages of capacitor 124A and of power sources 122A and 122B.

Figure 3G:
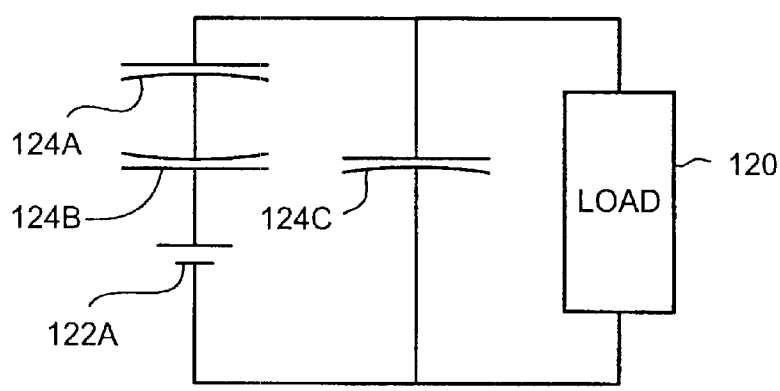

In FIG. 3G, the switching scheme includes a single power source 122A and three capacitors 124A, 124B and 124C. Power source 122A and capacitors 124A and 124B are connected in series there between. Capacitor 124C is connected in parallel to power source 122A and capacitors 124A and 124B, and they all are connected to load 120. In this switching scheme the polarity of capacitor 124B is inverted with respect to the polarity of capacitors 124A and 124C and of power source 122A.

The power reservoirs are energy storage elements having electrical interfaces (e.g., capacitors, inductors, and the like). Accordingly, since some of the switching schemes include power reservoirs, the resulting power levels are not constant and are affected by the way these power reservoirs are coupled. For example, when a capacitor is connected in parallel to the load, it discharges and hence, the absolute voltage level applied to the load decreases.

In general, the set of power levels varies with the operation of the system. Each of the power reservoirs can either be charged or discharged, thereby changing its power level and hence, affecting the existing set of power levels, available through the switching schemes.

Figure 4B:
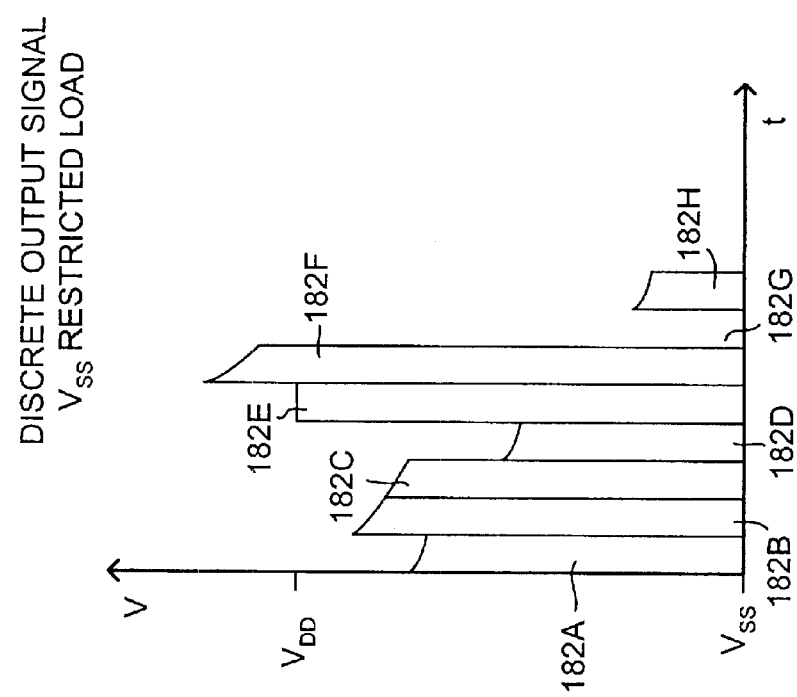
FIG. 4B illustrates a unipolar output signal applied to a load.
Figure 4A:
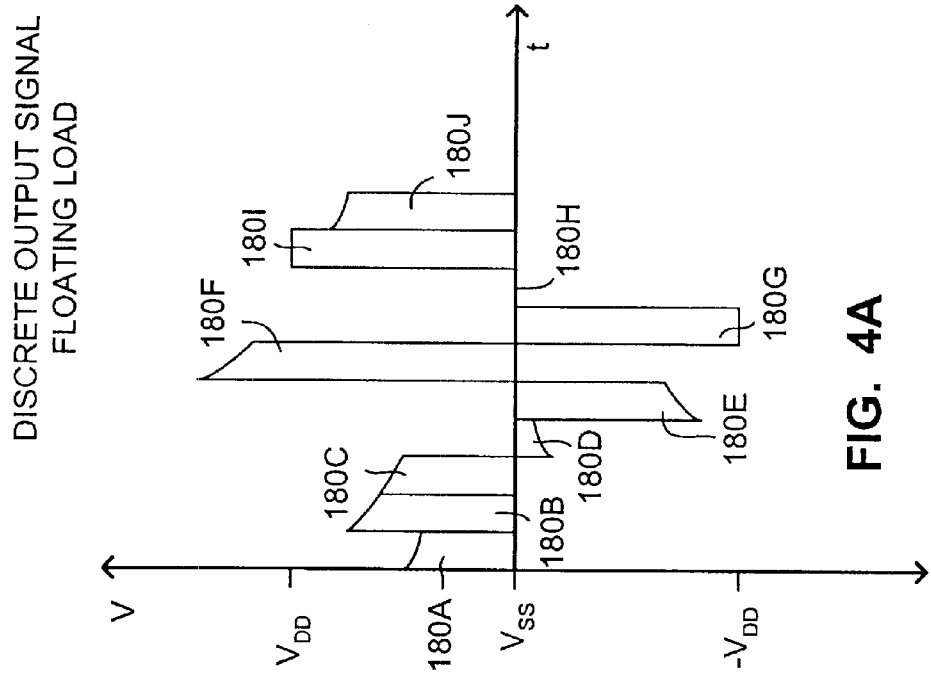
FIGS. 4A and 4C illustrate bipolar output signals applied to a load.
Figure 4C:
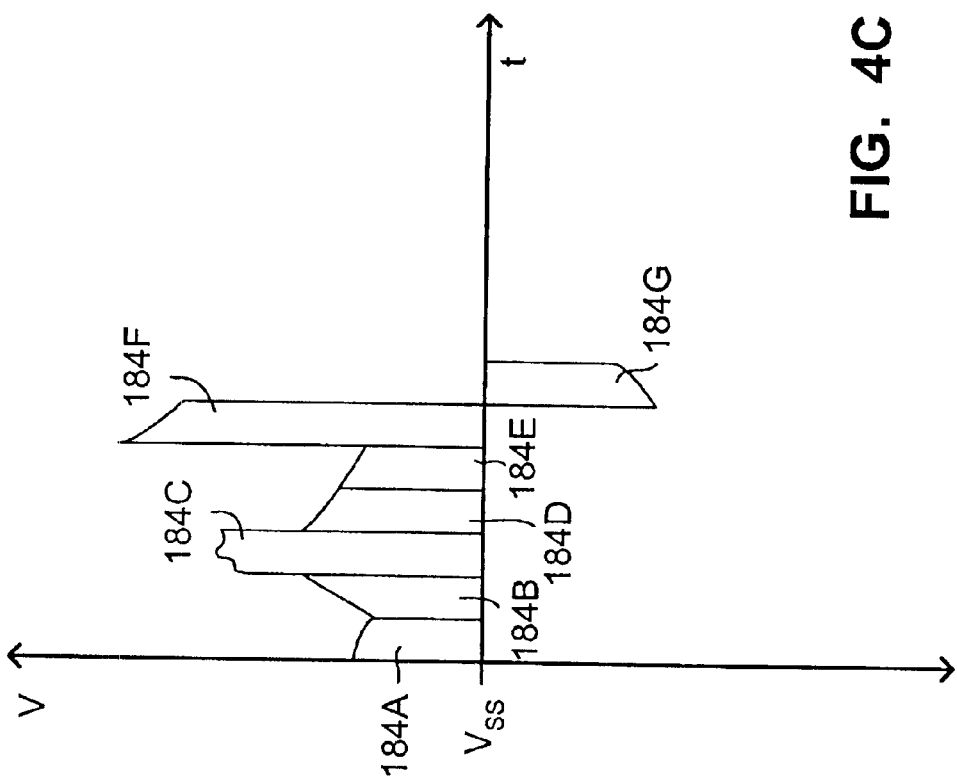

Reference is now made to FIGS. 4A, 4B and 4C. FIGS. 4A and 4C illustrate bipolar output signals applied to the load. FIG. 4B illustrates a unipolar output signal applied to the load. Each of the bars, generally referenced 180, 182 and 184, represents the resulting output due to the selection of a certain switching scheme. When switch 106 applies a new switching scheme (i.e., different than the current one), the line between the respective adjacent bars represents a switching event. In all of the FIGS. 4A, 4B and 4C, $V_{SS}$ is defined to be zero.

With reference to FIG. 4A, $V_{DD}$ and $-V_{DD}$ (i.e., $V_{DD}$ inversely connected), relative to $V_{SS}$, represent a power source unit, which can be selected from power source array 110 (FIG. 2A). Bars 180A, 180B, 180C and 180J represent output signals, which are lower than $V_{DD}$ and higher than $V_{SS}$. In the switching schemes, respective of bars 180A, 180B, 180C and 180J, a capacitor is either charged or discharged. When the capacitor is charged, it can, for example, be coupled in series to the load and further to a power source, as in the above FIG. 3D. When the capacitor discharges, it can, for example, be coupled in parallel to the load, as in the above FIG. 3C. In the example set forth in FIG. 4A, bars 180B and 180C represent a situation where the switching scheme of bar 180B remains unchanged for bar 180C, thereby forming a continuous signal. This situation occurs when controller 104 determines that a switching event is not required at the point between bars 180B and 180C.

Bars 180D and 180E represent negative output signals, which are higher than $-V_{DD}$ and lower than $V_{SS}$. The switching schemes, respective of bars 180D and 180E, are similar to those of bars 180A, 180B, 180C and 180J, with an inversion coupling to the load.

Bar 180F represents a positive output signal, which is higher than $V_{DD}$. A switching scheme for producing the output signal of bar 180F, would include, for example, a capacitor coupled in series to a power source or another capacitor in a way, which adds their voltages together. Such a switching scheme can be selected according to the one illustrated in FIG. 3D, wherein the capacitor is inversely coupled.

Bars 180G, 180H and 180I represent output signals, which are equal to one of the voltage levels of the power source. Bar 180G represents an output signal equal to $-V_{DD}$, respective of a switching scheme such as the one provided in FIG. 3B. Bar 180I represents an output signal equal to $+V_{DD}$, respective of a switching scheme such as the one provided in FIG. 3A. Bar 180H represents an output signal equal to zero, respective of a switching scheme in which both ends of the load are short-circuited.

With reference to FIG. 4B, $V_{DD}$ relative to $V_{SS}$, represents a power source unit, which can be selected from power source array 110. Bars 182A, 182B, 182C, 182D and 182H represent output signals, which are lower than $V_{DD}$ and higher than $V_{SS}$. In the switching schemes, respective of bars 182A, 182B, 182C, 182D and 182H, a capacitor is either charged or discharged. When the capacitor is charged, it can, for example, be coupled in series to the load and further to a power source, as in the above FIG. 3D. When the capacitor discharges, it can, for example, be coupled in parallel to the load, as in the above FIG. 3C. In the example set forth in FIG. 4B, bars 182B and 182C represent a situation where the switching scheme of bar 182B remains unchanged for bar 182C, thereby forming a continuous signal. This situation occurs when is controller 104 determines that a switching event is not required at the point between bars 182B and 182C.

Bar 182F represents a positive output signal, which is higher than $V_{DD}$. A switching scheme for producing the output signal of bar 182F, would include, for example, a capacitor coupled in series to a power source or another capacitor in a way, which adds their voltages together. Such a switching scheme can be selected according to the one illustrated in FIG. 3D, wherein the capacitor is inversely coupled.

Bars 182E and 182G represent output signals, which are equal to one of the voltage levels of the power sources. Bar 182E represents an output signal equal to $V_{DD}$, respective of a switching scheme such as the one provided in FIG. 3A. Bar 182G represents an output signal equal to zero, respective of a switching scheme, in which both ends of the load are short-circuited.

With reference to FIG. 4C, bars 184D, 184E and 184F represent output signals, resulting from switching schemes, in which a capacitor is either charged or discharged. Bars 184D and 184E represent a situation where the switching scheme of bar 184D remains unchanged for bar 184E, thereby forming a continuous signal. This situation occurs when controller 104 determines that a switching event is not required at the point between bars 184D and 184E. Bars 184A, 184B, 184C and 184G represent output signals resulting from switching schemes, which include non-constant power sources. For producing the output signal represented by bar 184A, controller 104 selects, for example, a sine shaped power source at a positive descending phase. For producing the output signal represented by bar 184B, controller 104 selects, for example, a triangular shaped power source. at a positive ascending phase. For producing the output signal represented by bar 184C, controller 104 selects, for example, a non-stable DC power source. For producing the output signal represented by bar 184G, controller 104 selects, for example, a sine shaped power source at a negative ascending phase.

According to another aspect of the invention, controller 104 can receive other signals, in addition to $V_{TRGT}$ which may affect the switching scheme decision and optimize it, such as the actual input signal, feedback signals received from the switch, and the like.

Figure 5:
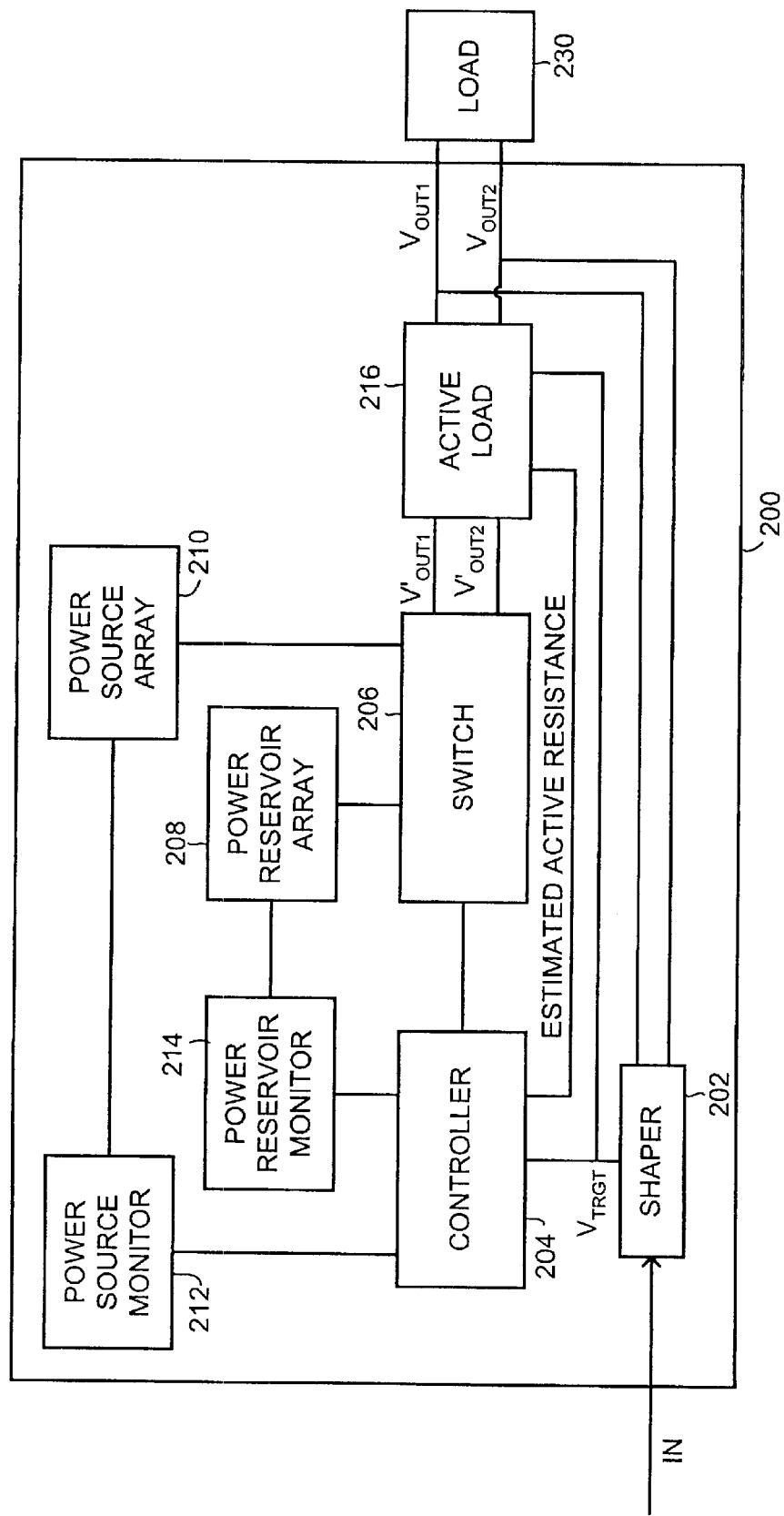
FIG. 5 is a schematic illustration of a power amplifier, constructed and operative in accordance with a further preferred embodiment of the disclosed technique.

Reference is now made to FIG. 5, which is a schematic illustration of a power amplifier, generally referenced 200, constructed and operative in accordance with a further preferred embodiment of the disclosed technique. Power amplifier 200 includes a shaper 202, a controller 204, a switch 206, a power reservoir array 208, a power source array 210, a power reservoir monitor 214, a power source monitor 212 and an active load 216. Power amplifier 200 is generally similar to power amplifier 100, but with the addition of active load 216, which reduces noise and increases the overall power efficiency.

Shaper 202 is connected to controller 204, to active load 216 and to the output terminals of the power amplifier 200. Controller 204 is further connected to switch 206 and to active load 216. Power reservoir monitor 214 is connected to controller 204 and to power reservoir array 208. Power source monitor 212 is connected to controller 204 and to power source array 210. Power reservoir array 208 and power source array 210 are further connected to switch 206. Active load 216 is further connected to output terminals of switch 206. The output terminals of active load 216 define the output terminals of power amplifier 200, to be further connected to load element 230.

Shaper 202 receives an input signal from an input source (not shown) and a feedback signal from the output terminals of power amplifier 200. Shaper 202 analyzes the feedback signal with respect to the input signal and produces a subsequent best output signal $V_{TRGT}$. Theoretically, that subsequent best output signal $V_{TRGT}$ should be applied to load element 230. Shaper 202 provides that subsequent best output signal $V_{TRGT}$ to controller 204 and to active load 216.

Power source monitor 212 monitors the available power levels, which are currently available by power source array 210 and provides this information to controller 204. Power reservoir monitor 214 monitors the available power levels, which are currently available by power reservoir array 208 and provides this information to controller 204.

Controller 204 selects the most suitable combination of power sources and power reservoirs, according to the subsequent best output signal $V_{TRGT}$ and determines a respective switching scheme. The switching scheme determines the way of coupling the selected power sources and power reservoirs there between and further to the in-series connected active load 216, as shall be described further below. Controller 204 provides the switching scheme to switch 206. Switch 206 applies the switching scheme to the selected power reservoirs of power reservoir array 208, the selected power sources of power source array 210 and further to active load 216.

For each switching event, controller 204 estimates an active impedance, that should be applied in series to load element 230, so as to reduce the difference between the output signal and the subsequent best output signal $V_{TRGT}$, under the newly determined switching scheme. Controller 204 provides the estimated active impedance to active load 216.

The result of applying the switching scheme with the selected power sources and power reservoirs on active load 216, yields a substantially discrete power level $V'_{OUT} = V'_{OUT1} - V'_{OUT2}$. Power level $V'_{OUT}$ is essentially an approximation of the subsequent best output signal $V_{TRGT}$, using the selected power sources and power reservoirs, under certain restrictions and limitations. Active load 216, being set to the estimated active impedance (received from controller 204) further refines the approximation, thereby producing an output power level $V_{OUT} = V_{OUT1} - V_{OUT2}$, which is, in most cases, closer to the subsequent best output signal $V_{TRGT}$, than $V'_{OUT}$.

As long as that switching scheme is applied, active load 216 tracks changes in $V'_{OUT}$ and in $V_{TRGT}$ and adjusts the active impedance, accordingly, so as to obtain the best approximation of subsequent best output signal $V_{TRGT}$, at the output thereof. As stated above, shaper 202 detects the power level at the output of active load 216 and utilizes it to determine the subsequent best output signal $V_{TRGT}$.

Controller 204 can be operated according to a plurality of methods. Each method is related to the environmental conditions regarding the nature of the power sources of power source array 210, the nature of the power reservoirs of power reservoir array 208, the architecture of switch 206, the architecture of active load 216 and the nature of load 230.

The following is an example of a method for operating controller 204, using a single power source denoted ($V_{DD}$, $V_{SS}$) and a plurality (N) of floating capacitors $C_1 \div C_N$. The term floating denotes that neither of the capacitors is hard-wire restricted to a power source. In order to simplify the explanation, $V_{SS}$ is defined to be zero. It is however noted that $V_{SS}$ can be defined to be any desirable value.

1. Each of the capacitors $C_n$ can either be floating or connected so that one leg of the capacitor is coupled to one leg of the load and the other leg of the capacitor is either coupled to the other leg of the load or to a power source ($V_{DD}$ or $V_{SS}$).
2. One leg of the load is coupled either to a leg of a capacitor or to a power source ($V_{DD}$ or $V_{SS}$). The other leg of the load is coupled either to a leg of a capacitor, to a power source ($V_{DD}$ or $V_{SS}$) or both to a leg of a capacitor and to a power source ($V_{DD}$ or $V_{SS}$).
3. Let $R = V_{DD}/(2N+1)$ and let $k \in (0,1]$. $\forall n \in \{1, 2, \ldots, N\}$, capacitor $C_n$ is allowed to be charged, as long as $V(C_n) < (2n+k)R$, where $V(C_n)$ denotes the current voltage of capacitor $C_n$.
4. Let $R = V_{DD}/(2N+1)$ and let $k \in (0,1]$. $\forall n \in \{1, 2, \ldots, N\}$, capacitor $C_n$ is allowed to be discharged, as long as $V(C_n) > (2n-k)R$, where $V(C_n)$ denotes the current voltage of capacitor $C_n$.
5. Define $V'_{OUT} = V'_{OUT1} - V'_{OUT2}$ and $V_{TRGT}$ as the voltage level of the subsequent best output signal $V_{TRGT}$. Let $w \in [1, \infty)$ be a weighting factor defining the ability of controller 204 to accurately estimate the active impedance to be set to active load 216. According to this method, the controller selects a switching scheme, which minimizes the term:

$$\begin{cases} |V_{TRGT} - V'_{OUT}|, & V_{TRGT} \leq V'_{OUT} \\ w|V_{TRGT} - V'_{OUT}|, & V_{TRGT} > V'_{OUT} \end{cases}$$

under the above restrictions 1, 2, 3 and 4.

It is noted that the weighting factor w, defined in the above algorithm, mainly represents two factors. The first factor is the expected accuracy of the estimation passed from controller 204 to active load 216. The better this estimation, the greater is the value of w. The second factor is the tolerance for heat dissipation in the system (across active load 216). The better this tolerance, the greater is the value of w.

The object of active load 216 is to set $V_{OUT}$ as close as possible to $V_{TRGT}$, in a way which improves the approximation of $V_{TRGT}$ provided by $V'_{OUT}$ (i.e., $|V_{TRGT} - V_{OUT}| < |V_{TRGT} - V'_{OUT}|$). The inner structure of active load 216 can include any electronic, Electro-optical, Electro-mechanical element, at any given structure. For example, active load 216 can include inductors, capacitors, resistors, nonlinear transfer electronic circuits, power-pushing elements, and the like. In general, $H_{AL}$ denotes the transfer function from $V'_{OUT}$ to $V_{OUT}$. Setting $H_{AL}$ at a certain value, can affect the output signal voltage $V_{OUT}$ across load element 230 to be greater, equal or smaller than $V'_{OUT}$.

Figure 6A:
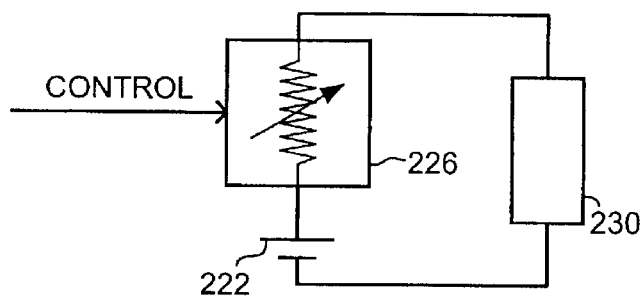
FIGS. 6A, 6B and 6C are schematic illustrations of switching schemes for the switch of FIG. 5 in combination with the active load of FIG. 5, according to other preferred embodiments of the disclosed technique.
Figure 6B:
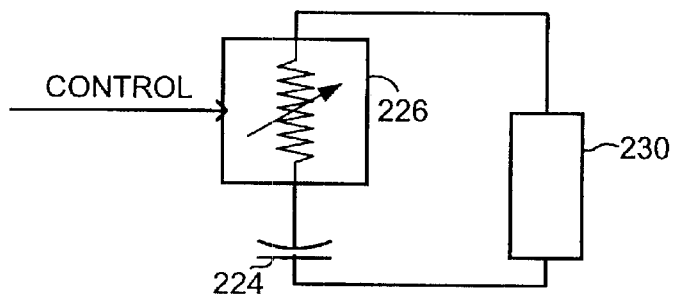
Figure 6C:
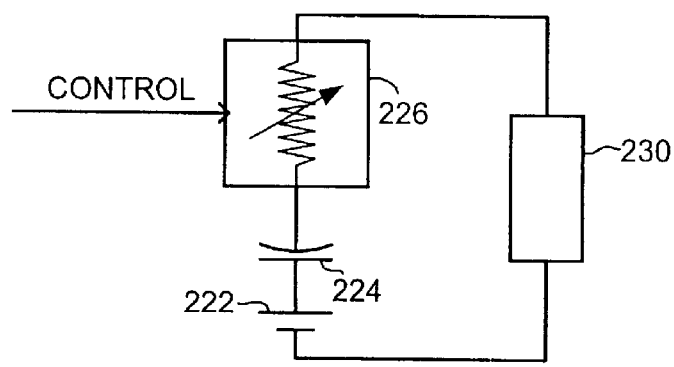

Reference is now made to FIGS. 6A, 6B and 6C, which are schematic illustrations of switching schemes for switch 206 in combination with active load 216, according to other preferred embodiments of the disclosed technique. The embodiments of FIGS. 6A, 6B and 6C, present a simplified implementation of active load 216, which includes a controlled variable resistor 226, connected in series to load element 230. Controlled variable resistor 226 receives a control signal, setting it to a variety of values.

The power source illustrated in FIGS. 6A and 6C is selected from the power sources available in power source array 210 of FIG. 5 and is referenced 222. The capacitor illustrated in FIGS. 6B and 6C is selected from the power reservoirs available in power reservoir array 208 of FIG. 5 and is referenced 224.

In FIG. 6A, the switching scheme includes a single power source 222, a controlled variable resistor 226 and a load element 230. All described components are connected in series, forming a closed loop. Controlled variable resistor 226 receives a control signal, which sets it to a selected resistance value, thereby reducing the absolute value of voltage applied across load element 230. This arrangement is for example used when the selected switching scheme provides a switch 206 output signal $V'_{OUT}$, which is greater than the subsequent best output signal $V_{TRGT}$. In a case where $|V'_{OUT}| \leq |V_{TRGT}|$, the resistance of controlled variable resistor 226 is set to zero.

In FIG. 6B, the switching scheme includes a single capacitor 224, a controlled variable resistor 226 and load element 230. All described components are connected in series, forming a closed loop. Capacitor 224 is discharged, while connected according to this switching scheme, thereby affecting $|V'_{OUT}|$ to decrease in time, which in turn affects the controlled variable resistor 226, through its control.

In FIG. 6C, the switching scheme includes single power source 222, single capacitor 224, controlled variable resistor 226 and load element 230. All described components are connected in series, forming a closed loop. Capacitor 224 can either be charged or discharged, while connected according to this switching scheme, thereby affecting $|V'_{OUT}|$ to decrease in time, which in turn affects the controlled variable resistor 226, through its control.

With reference to the embodiments presented in FIGS. 6A, 6B and 6C, at the switching event, controlled variable resistor 226 receives an initial control signal, which sets it to a selected resistance value. From this moment, until the subsequent switching event, controlled variable resistor 226 receives additional control signals, which set it to other resistance values, according to the changes in $V'_{OUT}$. If $V_{TRGT}$ is updated between switching events, it affects these additional control signals as well. All of these additional control signals improve the approximation of $V_{TRGT}$ provided by $V'_{OUT}$.

According to a further embodiment of the invention (not shown) controller 204 (FIG. 5) is not directly connected to active load 216, and hence does not provide the initial impedance value thereto. Accordingly, at each switching event, active load 216 is set to a certain impedance value (e.g., zero, a function of the previous and the current values of $V'_{OUT}$, a random value, and the like) and then updates that impedance according to $V_{TRGT}$ and $V'_{OUT}$. According to another embodiment of the invention (not shown) the shaper 202 (FIG. 5) is not directly connected to active load 216. Hence, the active load is set to have constant impedance at each switching event which remains until next switching event.

In the embodiment presented in FIG. 5, controller 204 provides a digital control signal to switch 206. This control signal includes a plurality of control commands, which can either be connect commands or disconnect commands. In turn, switch 206 either connects or disconnects elements in a switching scheme (i.e., each connection within switch 206 is either shorted or cut).

According to another embodiment of the invention, the controller provides an analog control signal to the switch. This control signal includes a plurality of control commands, which can be connect commands, disconnect commands or resistively connect commands. The resistively connect command can include any resistance value between zero and infinity. In practice, this embodiment incorporates active load functionality into the switch.

Figure 7:
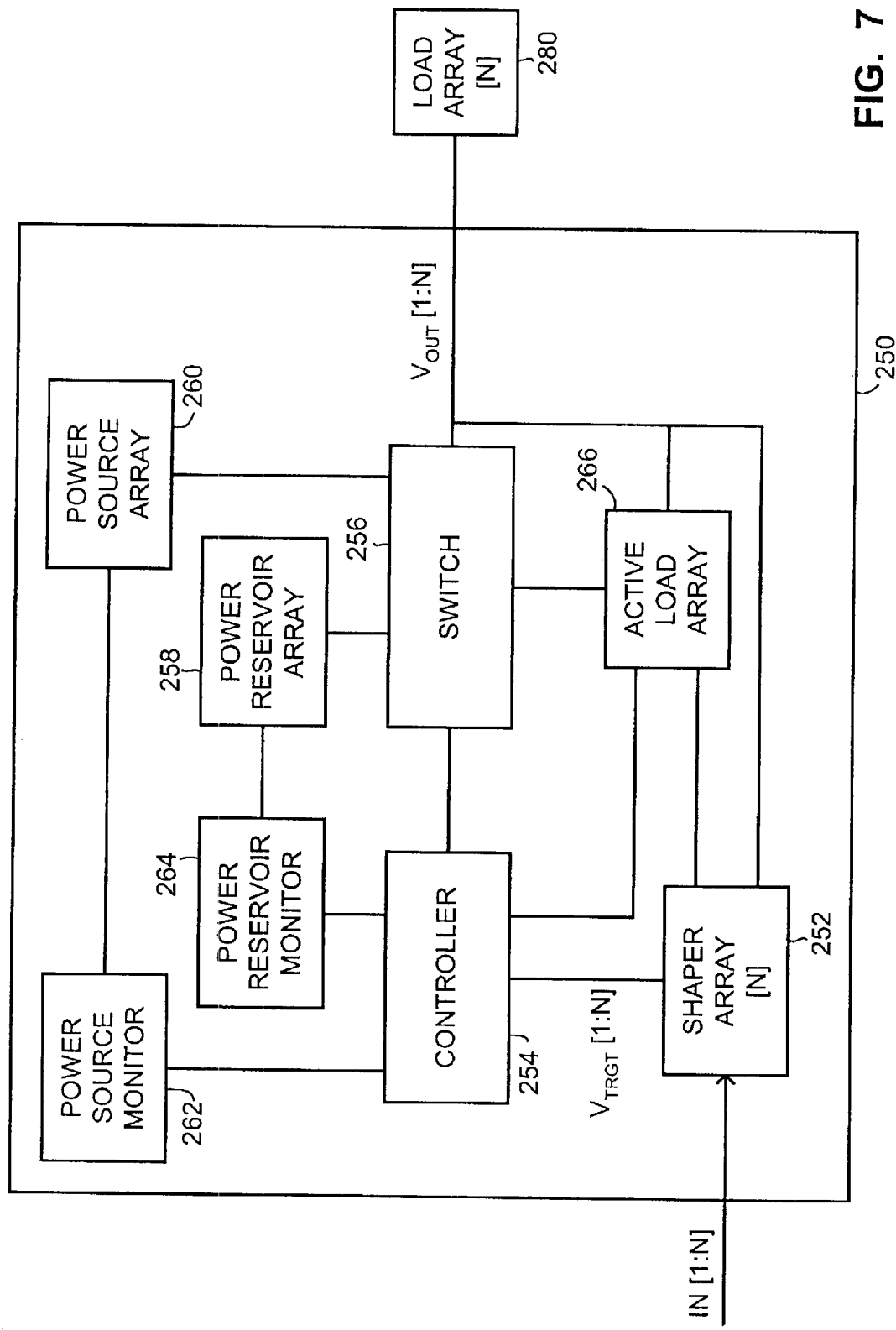
FIG. 7 is a schematic illustration of a power amplifier, constructed and operative in accordance with a further preferred embodiment of the disclosed technique.

Reference is now made to FIG. 7, which is a schematic illustration of a power amplifier, generally referenced 250, constructed and operative in accordance with a further preferred embodiment of the disclosed technique. Power amplifier 250 includes a shaper array 252, a controller 254, a switch 256, a power reservoir array 258, a power source array 260, a power reservoir monitor 264, a power source monitor 262 and an active load array 266. Power amplifier 250 is generally similar to power amplifier 200, but is designed to address multiple load elements.

Shaper array 252 is connected to controller 254 and to the output terminals of the power amplifier 250. Controller 254 is further connected to switch 256. Power reservoir monitor 264 is connected to controller 254 and to power reservoir array 258. Power source monitor 262 is connected to controller 254 and to power source array 260. Power reservoir array 258 and power source array 260 are further connected to switch 256. Active load array 266 is connected to switch 256, to controller 254, to shaper array 252 and to the output terminals of power amplifier 250. The output (terminals) of switch 256 define the output terminals of power amplifier 250, which are further connected to load array 280. Each load element of load array 280 is assigned a specific shaper, selected from shaper array 252. Each of the load elements is coupled to switch 256 via a respective pair of output terminals (not shown), which are further coupled to the respective shaper.

Amplifier 250 receives a plurality of N input signals IN[1:N]. Each of these input signals is to be power amplified and provided to a respective load element of load array 280. It is noted that any of the input signals can be provided to more than one load element. In this case, the architecture of the invention assigns a different shaper to each of these load elements. Input signal IN[n] is fed to the respective shaper, which further receives a feedback signal $V_{OUT}$[n] from the respective pair of output terminals of power amplifier 250. Each shaper analyzes the respective feedback signal $V_{OUT}$[n] against the respective input signal IN[n] and produces a respective subsequent best output signal $V_{TRGT}$[n]. Shaper array 252 provides that subsequent best output signals $V_{TRGT}$[1:N] to controller 254. Shaper array 252 provides the subsequent best output signals $V_{TRGT}$[1:N] to active load array 266. It is noted that shaper array 252 can alternatively provide approximations of the subsequent best output signals $V_{TRGT}$[1:N] to active load array 266.

Power source monitor 262 monitors the available power levels, which are currently available by power source array 260 and provides this information to controller 254. Power reservoir monitor 264 monitors the available power levels, which are currently available by power reservoir array 258 and provides this information to controller 254.

Controller 254 selects the most suitable combination of power sources, power reservoirs and active load elements, according to the subsequent best output signals $V_{TRGT}$[1:N] and determines a respective switching scheme. The switching scheme determines the way of coupling the selected power sources, power reservoirs and active load elements there between and further to load elements of load array 280, as shall be described further below. Controller 254 provides the switching scheme to switch 256. Switch 256 applies the switching scheme to the selected power reservoirs of power reservoir array 258, to the selected power sources of power source array 260, to the selected active load elements of active load array 266 and further to all the load elements of load array 280.

For each switching event, controller 254 estimates active is impedance values, that should be applied to active load elements of active load array 266. These active impedance values attempt to minimize a weighted function, $$f(V_{TRGT}[1]-V_{OUT}[1], V_{TRGT}[2]-V_{OUT}[2], \ldots, V_{TRGT}[N]-V_{OUT}[N])$$

under the newly determined switching scheme. Controller 254 provides the estimated active impedance values to active load array 266.

As long as that switching scheme is applied, active load array 266 tracks changes in $V_{OUT}$[1:N] and in $V_{TRGT}$[1:N], and adjusts the active impedance values, accordingly, so as to minimize the weighted function $$f(V_{TRGT}[1]-V_{OUT}[1], V_{TRGT}[2]-V_{OUT}[2], \ldots, V_{TRGT}[N]-V_{OUT}[N]).$$

Figure 8A:
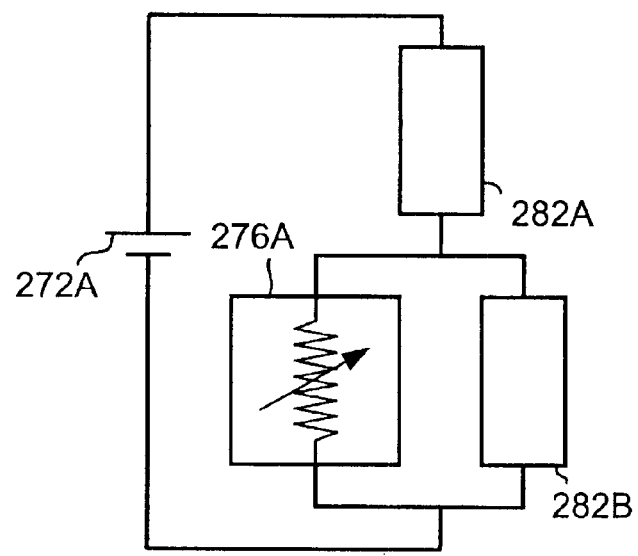
FIGS. 8A, 8B and 8C are schematic illustrations of switching schemes for the switch of FIG. 7, addressing multiple load situations.
Figure 8B:
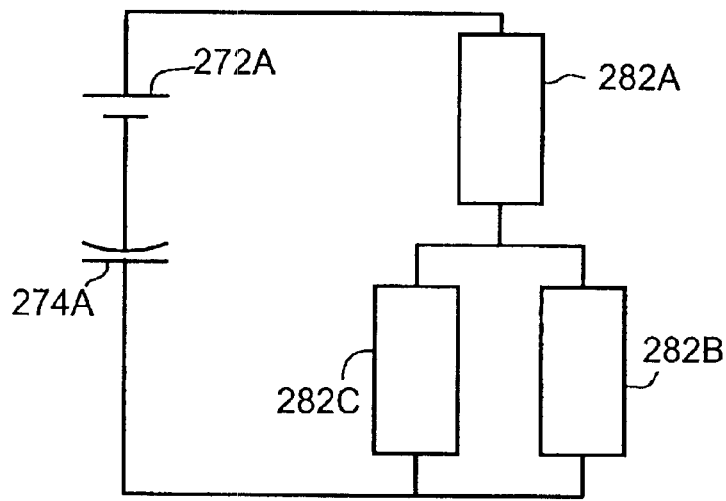
Figure 8C:
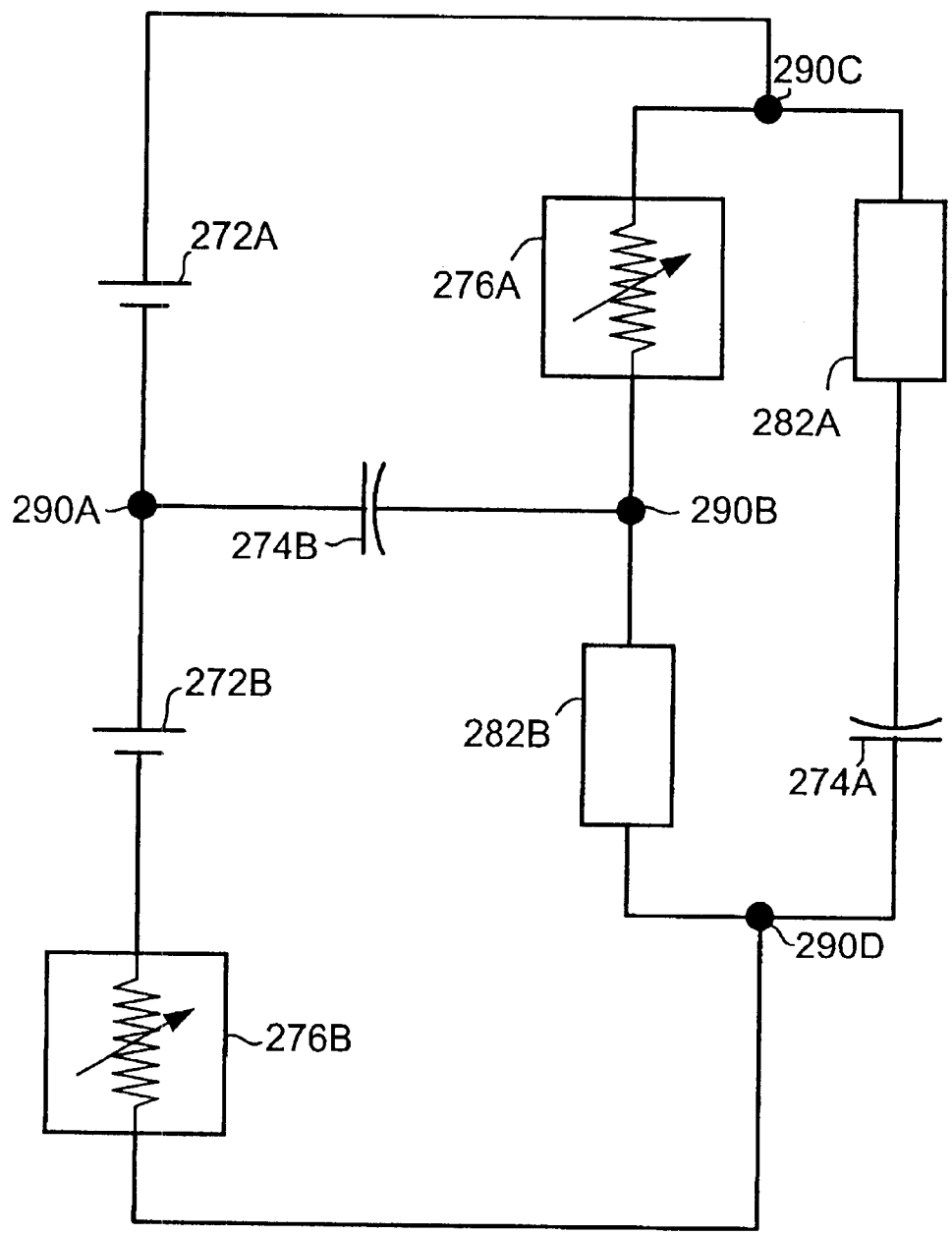

Reference is now made to FIGS. 8A, 8B and 8C, which are schematic illustrations of switching schemes for switch 256 (FIG. 7), addressing multiple load situations. The power sources 272A (FIGS. 8A, 8B and 8C) and 272B (FIG. 8C) are selected from the power sources available in power source array 260 of FIG. 7. The capacitors 274A (FIGS. 8B and 8C) and 274B (FIG. 8C) are selected from the power reservoirs available in power reservoir array 258 of FIG. 7. Controlled variable resistors 276A (FIGS. 8A and 8C) and 276B (FIG. 8C) are selected from the active load elements available in active load array 266 of FIG. 7. Load elements 282A, 282B (FIGS. 8A, 8B and 8C) and 282C (FIG. 8B) are all load elements available in load array 280 of FIG. 7.

In FIG. 8A, the switching scheme includes single power source 272A and controlled variable resistor 276A. Power source 272A is connected in series to load element 282A. Load element 282B and controlled variable resistor 276A are connected in parallel there between and further in series to load element 282A and to power source 272A.

In FIG. 8B, the switching scheme includes a single power source 272A and a single capacitor 274A. Load element 282B and 282C are connected in parallel there between and further in series to load element 282A, power source 272A and capacitor 274A, thereby forming a closed loop.

In FIG. 8C, the switching scheme includes two power sources 272A and 272B, two capacitors 274A and 274B and two controlled variable resistors 276A and 276B. Power source 272B is connected in series to controlled variable resistor 276B and further between junctions 290A and 290D. Load element 282A is connected in series to capacitor 274A and further between junctions 290C and 290D. Load element 282B is connected between junctions 290B and 290D. Controlled variable resistor 276A is connected between junctions 290B and 290C. Capacitor 274B is connected between junctions 290A and 290B. Power source 272A is connected between junctions 290A and 290C.

According to another embodiment of the invention (not shown) the amplifier includes an external memory unit. The memory unit can be used for storing alternative sets of shaper parameters, for use according to changing nature of the input signal. The memory unit can also be used for storing controller parameters such as switching schemes, initial active load values, and the like.

Figure 9:
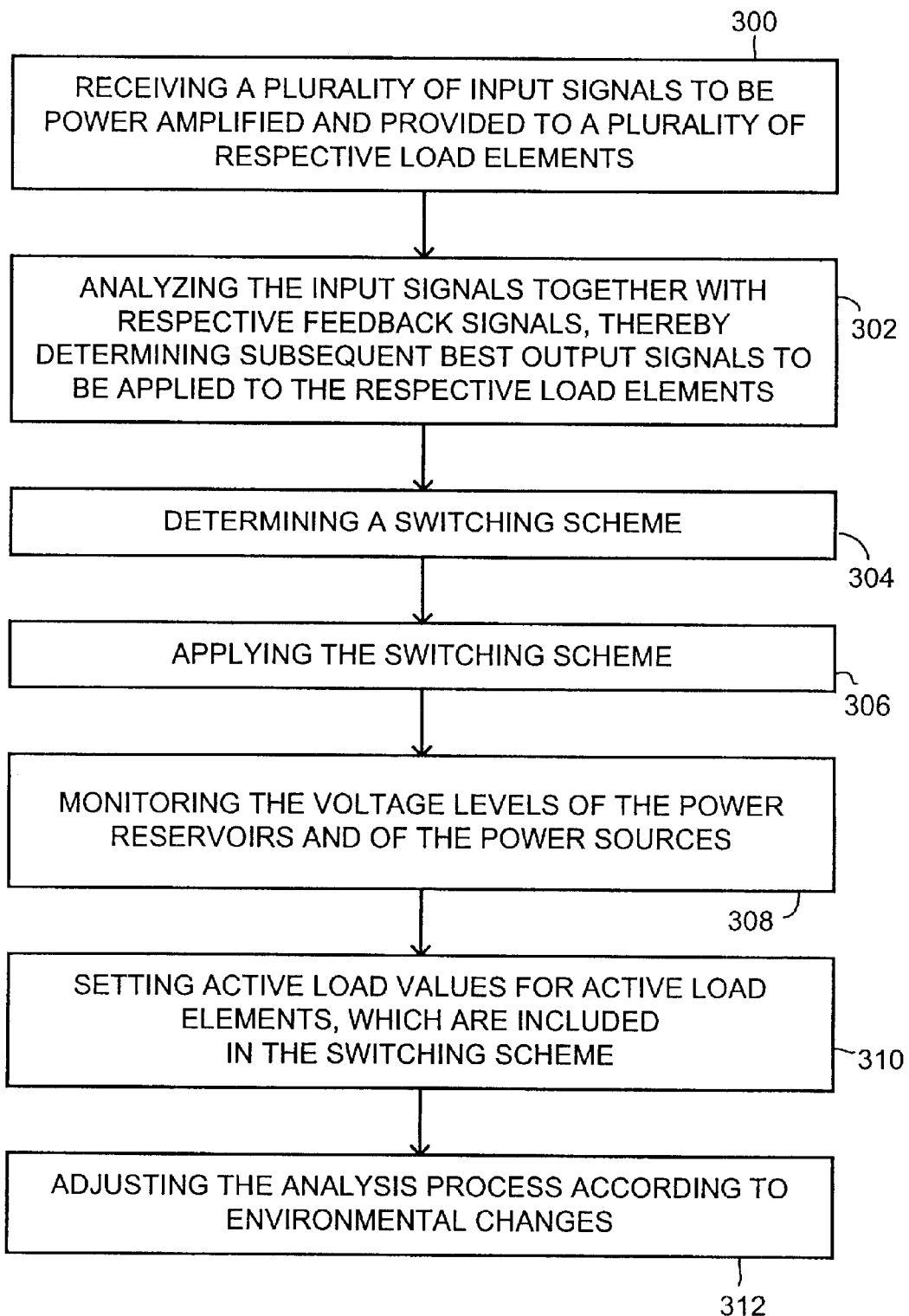

Reference is now made to FIG. 9, which is an illustration of a method for operating the system of FIG. 7, operative in accordance with another preferred embodiment of the invention. It is noted that this method can be reduced so as to adapt for operating the systems of FIGS. 2A and 5.

In step 300, a plurality of input signals are received. Each of these input signals is to be power amplified and provided to a plurality of respective load elements. It is noted that the method can be limited to a single input signal and a single load element. With reference to FIG. 7, shaper array 252 receives a plurality of input signals, each respective of a load element in load array 280.

In step 302, the input signals are analyzed together with respective feedback signals, thereby determining respective subsequent best output signals, to be applied to the respective load elements. With reference to FIG. 7, shaper array 252 assigns a shaper unit to each received input signal. Each of the shaper units further receives a feedback signal from the respective load element and analyzes the input signal according to that feedback signal, thereby determining a respective subsequent best output signal.

In step 304, a switching scheme is determined. The switching scheme includes all of the load elements of the respective input signals. The switching scheme can further include selected power sources, selected power reservoirs and selected active load elements. With reference to FIG. 7 controller 254 determines a switching scheme according to all of the subsequent best output signals received from shaper array 252. The switching scheme includes load elements of load array 280 as well as selected components such as power sources from power source array 260, power reservoir elements from power reservoir array 258 and active load elements from active load array 266. It is noted that some power schemes include only load elements and no other components (e.g., when all of the load elements are short-circuited).

In step 306, the switching scheme is applied. With reference to FIG. 7, switch 256 applies the switching scheme to the load elements in load array 280 and to all of the other components that were selected by controller 254.

In step 308, the voltage levels of the power reservoirs and of the power sources are monitored. With reference to FIG. 7, power source monitor 262 monitors the voltage levels of the power sources and power reservoir monitor 264 monitors the voltage levels of the power reservoirs which are included in the switching scheme. This information can later be used by controller 254 for determining the next switching scheme.

In step 310, active load values are set to active load elements, which are included in the switching scheme. With reference to FIG. 7, controller 254 sets active load values (initial values and real time updated values) to the active load elements in active load array 266.

In step 312, the analysis process is adjusted according to the nature of the input signal. With reference to FIG. 7, shaper array 252 monitors the input signals and adjusts the analysis process of selected shaper units, when the nature of their respective input signals changes in a way that requires such an adjustment. It is noted that the monitoring of the input signals and the adjustment of the analysis process can be performed by external modules, rather than by shaper array 252 itself. According to another aspect of the invention, the policies which are used by controller 254, for selecting switching schemes, are also updated according to various parameters, such as the nature of the input signal, and the like, either internally or by an external unit.

Figure 10A:
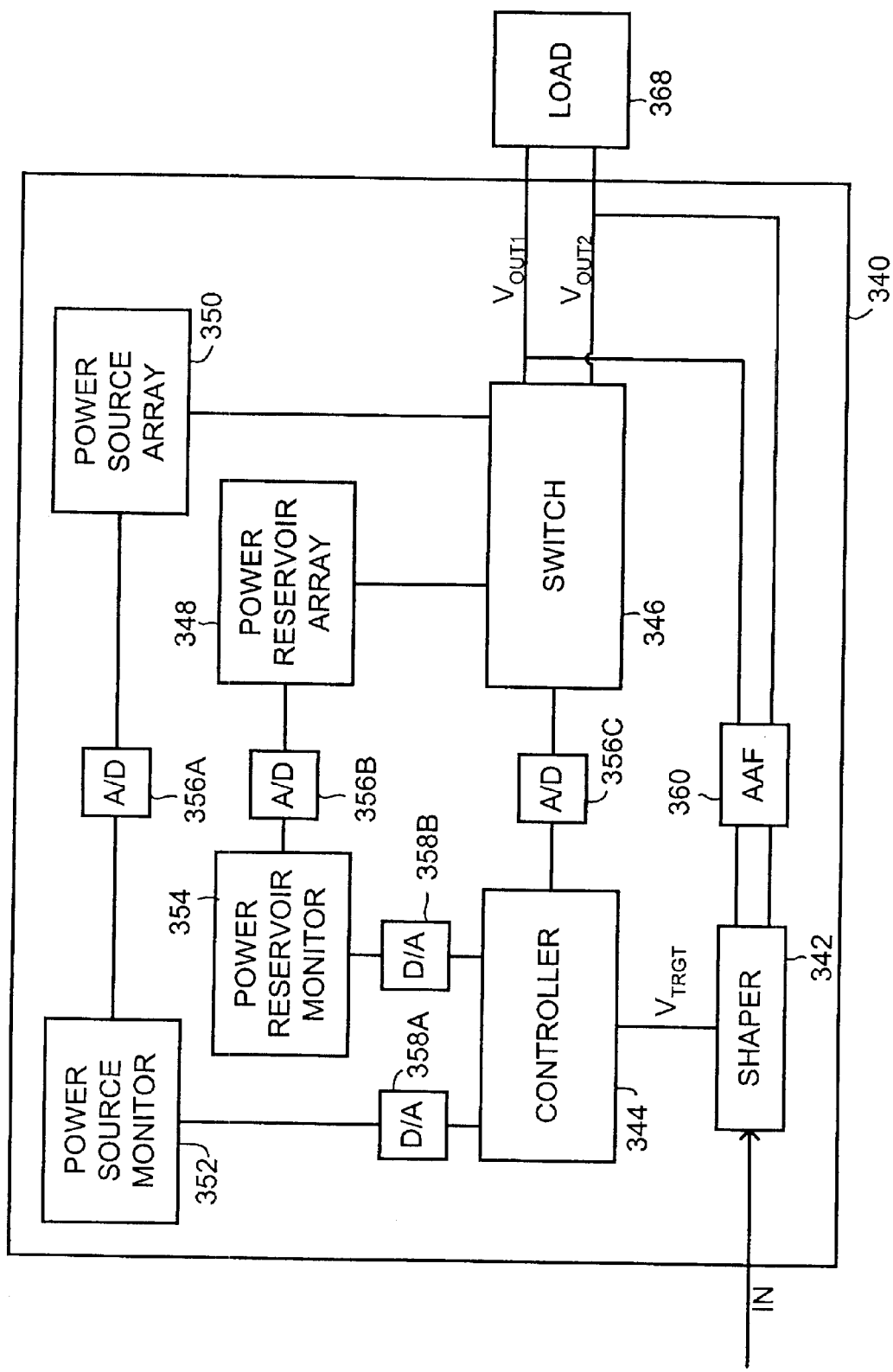
FIG. 10A is a schematic illustration of a power amplifier, constructed and operative in accordance with a further preferred embodiment of the disclosed technique.
Figure 10B:
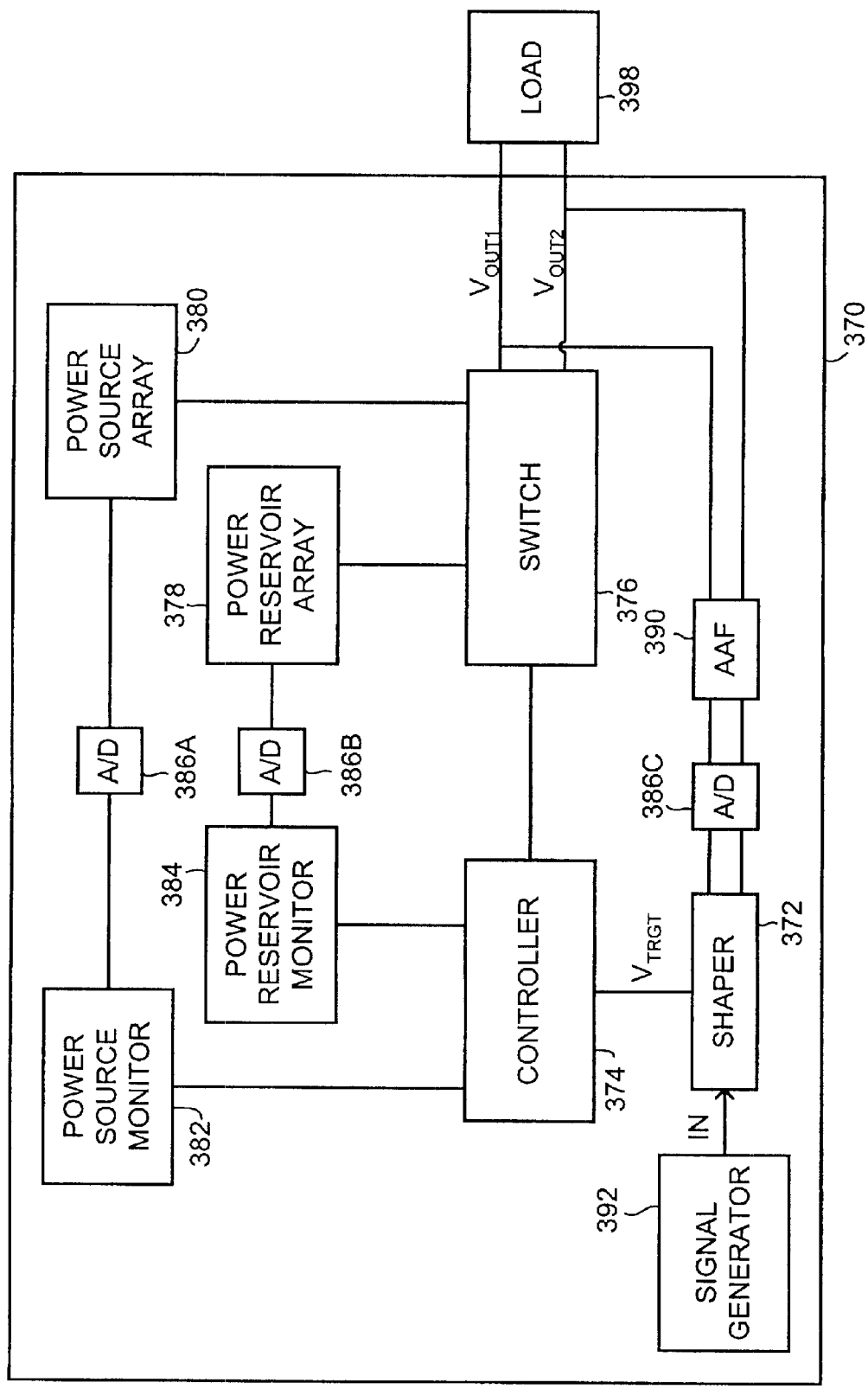
FIG. 10B is a schematic illustration of a power amplifier associated with a signal generator, constructed and operative in accordance with another preferred embodiment of the disclosed technique.

The disclosed technique can be implemented in an analog, digital or mixed architecture. Reference is now made to FIGS. 10A and 10B, which present two mixed approaches for implementing the disclosed technique. It is noted that the controller, the shaper, the power source monitor and the power reservoir monitor can each be implemented either as an analog or a digital unit. In addition, the shaper can further be implemented using switched capacitor architecture. It is noted that a switch can be defined to receive either digital (i.e., connect or disconnect) or analog (i.e., connect, disconnect or resistively connect) command signals.

FIG. 10A is a schematic illustration of a power amplifier, generally referenced 340, constructed and operative in accordance with a further preferred embodiment of the disclosed technique. Power amplifier 340 includes a switched capacitor architectured shaper 342, an analog controller 344, a digitally controlled switch 346, a power reservoir array 348, a power source array 350, a digital power reservoir monitor 354, a digital power source monitor 352, three analog to digital converters (A/D) 356A, 356B and 356C, two digital to analog converters (D/A) 358A and 358B and an anti-aliasing filter (AAF) 360.

Shaper 342 is connected to controller 344 and to AAF 360. AAF 360 is further connected to the output terminals of switch 346. Controller 344 is further connected to switch 346 via A/D converter 356C. Power reservoir monitor 354 is connected to controller 344 via DIA converter 358B and to power reservoir array 348 via A/D converter 356B. Power source monitor 352 is connected to controller 344 via D/A converter 358A and to power source array 350 via A/D converter 356A. Power reservoir array 348 and power source array 350 are further connected to switch 346. The output terminals of switch 346 define the output terminals of power amplifier 340, to be further connected to load element 368.

A/D converter 356A converts analog measurements, received from power source array 350, to digital format and provides respective digital signals to power source monitor 352. A/D converter 356B converts analog measurements, received from power reservoir array 348, to digital format and provides respective digital signals to power reservoir monitor 354. DIA converter 358A converts digital information, received from power source monitor 352, to analog format and provides respective analog signals to controller 344. D/A converter 358B converts digital information, received from power reservoir monitor 354, to analog format and provides respective analog signals to controller 344. A/D converter 356C converts analog switching commands, received from controller 344, to digital format and provides respective digital commands to switch 346. AAF 360 receives the output signal at the output terminals of power amplifier 340 and filters out frequencies, which would be aliased to the frequency bandwidth of interest otherwise. AAF 360 provides the filtered signal to shaper 342.

FIG. 10B, is a schematic illustration of a power supply, generally referenced 370, constructed and operative in accordance with another preferred embodiment of the disclosed technique. Power supply 370 includes a digital shaper 372, a digital controller 374, a digitally controlled switch 376, a power reservoir array 378, a power source array 380, a digital power reservoir monitor 384, a digital power source monitor 382, a digital signal source 392, three analog to digital converters (A/D) 386A, 386B and 386C and an anti-aliasing filter (AAF) 390.

Shaper 372 is connected to signal generator 392, controller 374 and to A/D converter 386C. AAF 390 is connected to the output terminals of switch 376 and to A/D converter 386C. Controller 374 is further connected to switch 376, to power reservoir monitor 384 and to power source monitor 382. Power reservoir monitor 384 is further connected to power reservoir array 378 via A/D converter 386B. Power source monitor 382 is further connected to power source array 380 via A/D converter 386A. Power reservoir array 378 and power source array 380 are further connected to switch 376. The output terminals of switch 376 define the output terminals of power supply 370, to be further connected to load element 398.

All of the digital units (i.e., controller 374, shaper 372, power source monitor 382, and power reservoir monitor 384), which are directly connected there between, exchange data digitally, with no conversion. A/D converter 386A converts analog measurements, received from power source array 380, to digital format and provides respective digital signals to power source monitor 382. A/D converter 386B converts analog measurements, received from power reservoir array 378, to digital format and provides respective digital signals to power reservoir monitor 384.

AAF 390 receives the output signal at the output terminals of power supply 370 and filters out frequencies, which would be aliased to the frequency bandwidth of interest otherwise. AAF 390 provides the filtered signal to A/D converter 386C, which in turn converts the filtered signal to digital format and provides respective digital signal to shaper 372.

In the example set forth in FIG. 10B, signal generator 392 provides a digital input signal to shaper 372. Hence, power supply 370 together with signal generator 392 are operative to produce a powered up signal. If signal generator 392 produces a SINE shaped signal at 50–60 Hz and the RMS voltage level at the output of power supply 370 is set to be 110 Volts, then this output can serve as an AC electrical power source.

The disclosed technique can be implemented in a plurality of fields, such as audio, wired or wireless RF transmission, controllable power units for Electro-mechanical modules, medical devices, power sources and the like.

In the field of audio amplifiers, the disclosed technique can be implemented as efficient power amplifiers, which operate in a power or voltage restricted environment (e.g., Blue-Tooth wireless audio units, cellular phones, wireless phones, battery operated toys, computer sound cards, computer speakers, USB speakers, and the like), as high SNR power amplifiers, which operate in a high end environment (e.g., hi-fi sound systems, multi-media sound systems, and the like) and as both (e.g., Walkman, Discman, MPman, wireless hi-fi earphones, television sets, extreme high power hi-fi amplifiers, and the like).

In the field of wired or wireless RF transmission, the disclosed technique can be implemented as efficient power amplifiers, which operate in a power, voltage or current restricted environment (e.g., locks transmitters, and the like), and as ultra linear power amplifiers (e.g., ADSL power amplifier, and the like).

In the field of controllable power units for Electro-mechanical modules, the disclosed technique can be implemented as efficient power amplifiers, which operate in a power, voltage or current restricted environment (e.g., Hard disks motors, compact disks motors, floppy disks motors, zoom motor of a camera, electric vehicles, satellite telescopes, and the like).

In the field of medical devices, the disclosed technique can be implemented as efficient power amplifiers, which operate in a power, voltage or current restricted environment (e.g., hearing aids, heart pace makers, heart micro-pumps, in-vivo injection units, and the like).

In the field of power sources, the disclosed technique can be implemented as efficient DC/AC converter, which operate in a power restricted environment (e.g., cars 220V plug, UPS, solar systems, and the like) and as efficient AC/AC converter, which operate in a power restricted environment (e.g., Gasoline generator, and the like).

It will be appreciated by persons skilled in the art that the disclosed technique is not limited to what has been particularly shown and described hereinabove. Rather the scope of the disclosed technique is defined only by the claims, which follow.

What is claimed is:

1. System, receiving at least one input signal to be amplified and provided to at least one respective load element, the system comprising:
    a switch, coupled to said at least one respective load element, for producing at least one respective switch output signal for said at least one input signal;
    at least one shaper determining at least one respective shaper output signal for each said at least one input signal, according to each said at least one input signal and said at least one respective switch output signal;
    a power source array, coupled to said switch, said power source array including at least one power source;
    a power reservoir array, coupled to said switch, said power reservoir array including at least one power reservoir; and
    a controller, coupled to said at least one shaper and to said switch, said controller determining a switching scheme according to at least a selected one of said at least one respective shaper output signal,
    wherein said switch applies said switching scheme to said at least one respective load element, to said power source array and to said power reservoir array.

2. The system according to claim 1, wherein said controller determines said switching scheme, further according to the source power levels of at least a selected one of said at least one power source.

3. The system according to claim 1, wherein said controller determines said switching scheme, further according to the reservoir power levels of at least a selected one of said at least one power reservoir.

4. The system according to claim 3, wherein said controller determines said switching scheme, further according to the source power levels of at least a selected one of said at least one power source.

5. The system according to claim 1, further comprising a power source monitor coupled to said power source array and to said controller,
    wherein said power source monitor monitors the source power levels of at least a selected one of said at least one power source and provides information respective of said monitored source power levels to said controller, and wherein said controller determines said switching scheme, further according to said information.

6. The system according to claim 1, further comprising a power reservoir monitor coupled to said power reservoir array and to said controller,
    wherein said power reservoir monitor monitors the reservoir power levels of at least a selected one of said at least one power reservoir and provides information respective of said monitored reservoir power levels to said controller, and wherein said controller determines said switching scheme, further according to said information.

7. The system according to claim 1, further comprising:
    a power source monitor coupled to said power source array and to said controller; and
    a power reservoir monitor coupled to said power reservoir array and to said controller,
    wherein said power source monitor monitors the source power levels of at least a selected one of said at least one power source and provides power source information respective of said monitored source power levels to said controller,
    wherein said power reservoir monitor monitors the reservoir power levels of at least a selected one of said at least one power reservoir and provides power reservoir information respective of said monitored reservoir power levels to said controller, and
    wherein said controller determines said switching scheme, further according to said power source information and said power reservoir information.

8. The system according to claim 1, wherein the type of each said at least one power source is selected from the list consisting of:
    chemical to electrical sources;
    physical to electrical sources;
    radiation to electrical sources;
    heat to electrical sources; and
    electrical to electrical sources.

9. The system according to claim 1, wherein the type of each said at least one power reservoir is selected from the list consisting of:
    capacitor; and
    inductor.

10. The system according to claim 1, wherein at least a selected one of said at least one shaper modifies the respective one of said at least one respective switch output signal, before analyzing said respective one of said at least one respective switch output signal.

11. The system according to claim 1, wherein at least one of said at least one respective shaper output signal is a subsequent best output signal.

12. The system according to claim 1, wherein at least one of said at least one respective shaper output signal is an approximation of a subsequent best output signal.

13. The system according to claim 1, wherein at least one of said at least one respective shaper output signal is a function of a subsequent best output signal.

14. The system according to claim 1, wherein said controller receives at least an additional signal, and wherein said controller determines said switching scheme further according to said at least additional signal.

15. The system according to claim 14, wherein said at least additional signal includes at least one of said at least one input signal.

16. The system according to claim 1, wherein said controller determines new switching schemes at spaced-apart time intervals.

17. The system according to claim 1, wherein said controller determines new switching schemes in real time.

18. The system according to claim 1, wherein said controller determines new switching schemes in real time upon satisfaction of a predetermined condition.

19. The system according to claim 1, further comprising at least one signal generator, coupled to said at least one shaper, wherein said at least one signal generator produces at least a selected one of said at least one input signal.

20. The system according to claim 1, wherein said switching scheme includes at least a selected one of said at least one power source.

21. The system according to claim 1, wherein said switching scheme includes at least a selected one of said at least one power reservoir.

22. The system according to claim 21, wherein said switching scheme includes at least a selected one of said at least one power source.

23. The system according to claim 1, wherein said switching scheme includes at least one component selected from the list consisting of:
at least a selected one of said at least one power reservoir;
at least a selected one of said at least one power source; and
at least a selected one of said at least one respective load element.

24. The system according to claim 1, wherein said switching scheme is series.

25. The system according to claim 1, wherein said switching scheme is parallel.

26. The system according to claim 1, wherein said switching scheme is mixed, having parallel and series connections.

27. The system according to claim 1, wherein at least one of said at least one shaper adjusts respective shaper parameters, according to system signals provided by said system.

28. The system according to claim 27, wherein said system signals include at least one selected from the list consisting of:
at least a selected one of said at least one input signal;
at least a selected one of the reservoir power levels of said at least one power reservoir;
at least a selected one of the source power levels of said at least one power source; and
at least a selected one of said at least one respective switch output signal.

29. The system according to claim 1, wherein said controller operates according to a switching scheme selection policy and wherein said controller adjusts said switching scheme selection policy according to system signals provided by said system.

30. The system according to claim 29, wherein said system signals include at least one selected from the list consisting of:
at least a selected one of said at least one input signal;
at least a selected one of the reservoir power levels of said at least one power reservoir; and
at least a selected one of the source power levels of said at least one power source.

31. The system according to claim 1, wherein said controller provides analog control signals to said switch.

32. System, receiving an input signal to be amplified and provided to a load element, the system comprising:
an active load, providing an active load output signal to said load element;
a switch, coupled to said active load;
a shaper determining a shaper output signal, according to said input signal and said active load output signal;
a power source array, coupled to said switch, said power source array including at least one power source;
a power reservoir array, coupled to said switch, said power reservoir array including at least one power reservoir, and
a controller, coupled to said shaper and to said switch, said controller determining a switching scheme, according to said shaper output signal;
wherein said switch applies said switching scheme to said power source array, to said power reservoir array and further to said active load; and
wherein the active impedance of said active load is determined according to system signals provided by said system.

33. The system according to claim 32, wherein said system signals include at least one signal selected from the list consisting of:
said shaper output signal; and
at least one of controller commands, provided by said controller.

34. The system according to claim 33, wherein said system signals further include a switch output signal, provided by said switch.

35. The system according to claim 32, wherein said controller determines said switching scheme, further according to the source power levels of at least a selected one of said at least one power source.

36. The system according to claim 32, wherein said controller determines said switching scheme, further according to the reservoir power levels of at least a selected one of said at least one power reservoir.

37. The system according to claim 36, wherein said controller determines said switching scheme, further according to the source power levels of at least a selected one of said at least one power source.

38. The system according to claim 32, further comprising a power source monitor coupled to said power source array and to said controller,
wherein said power source monitor monitors the source power levels of at least a selected one of said at least one power source, and provides information respective of said monitored source power levels to said controller.

39. The system according to claim 32, further comprising a power reservoir monitor coupled to said power reservoir array and to said controller,
wherein said power reservoir monitor monitors the reservoir power levels of a selected one of said at least one power reservoir, and provides information respective of said monitored reservoir power levels to said controller.

40. The system according to claim 32, further comprising:

a power source monitor coupled to said power source array and to said controller; and a power reservoir monitor coupled to said power reservoir array and to said controller, wherein said power source monitor monitors the source power levels of at least a selected one of said at least one power source and provides power source information respective of said monitored source power levels to said controller, wherein said power reservoir monitor monitors the reservoir power levels of at least a selected one of said at least one power reservoir and provides power reservoir information respective of said monitored reservoir power levels to said controller, and wherein said controller determines said switching scheme, further according to said power source information and said power reservoir information.

41. The system according to claim 32, wherein the type of each said at least one power reservoir is selected from the list consisting of:

capacitor; and inductor.

42. The system according to claim 32, wherein the type of said active load is selected from the list consisting of:

inductor;

capacitor;

resistor;

electronic circuit; and power-pushing element.

43. The system according to claim 32, wherein the type of at least a selected one of said at least one power source is selected from the list consisting of:

chemical to electrical sources;

physical to electrical sources;

radiation to electrical sources;

heat to electrical sources; and electrical to electrical sources.

44. The system according to claim 32, wherein said shaper modifies said active load output signal, before analyzing said active load output signal.

45. The system according to claim 32, wherein said shaper output signal is a subsequent best output signal.

46. The system according to claim 32, wherein said shaper output signal is an approximation of a subsequent best output signal.

47. The system according to claim 32, wherein said shaper output signal is a function of a subsequent best output signal.

48. The system according to claim 32, wherein said controller receives at least an additional signal, and wherein said controller determines said switching scheme further according to said at least additional signal.

49. The system according to claim 48, wherein said at least additional signal includes said input signal.

50. The system according to claim 32, wherein said controller determines new switching schemes at spaced-apart time intervals.

51. The system according to claim 32, wherein said controller determines new switching schemes in real time.

52. The system according to claim 32, wherein said controller determines new switching schemes in real time upon satisfaction of a predetermined condition.

53. The system according to claim 32, further comprising a signal generator, coupled to said shaper, wherein said signal generator produces said input signal.

54. The system according to claim 32, wherein said switching scheme includes at least a selected one of said at least one power source.

55. The system according to claim 32, wherein said switching scheme includes at least a selected one of said at least one power reservoir.

56. The system according to claim 55, wherein said switching scheme includes at least a selected one of said at least one power source.

57. The system according to claim 32, wherein said switching scheme includes at least one component selected from the list consisting of:

at least a selected one of said at least one power reservoir;

at least a selected one of said at least one power source; and said active load.

58. The system according to claim 32, wherein said switching scheme is series.

59. The system according to claim 32, wherein said switching scheme is parallel.

60. The system according to claim 32, wherein said switching scheme is mixed, having parallel and series connections.

61. The system according to claim 32, wherein said shaper adjusts respective shaper parameters, according to system signals provided by said system.

62. The system according to claim 61, wherein said system signals include at least one of the list consisting of:

said input signal;

reservoir power levels of at least a selected one of said at least one power reservoir;

source power levels of at least a selected one of said at least one power source; and switch output signal provided by said switch.

63. The system according to claim 32, wherein said controller operates according to a switching scheme selection policy and wherein said controller adjusts said switching scheme selection policy according to system signals provided by said system.

64. The system according to claim 63, wherein said system signals include at least one of the list consisting of:

said input signal;

reservoir power levels of at least a selected one of said at least one power reservoir; and source power levels of at least a selected one of said at least one power source.

65. System, receiving at least one input signal to be amplified and provided to at least one respective load element, the system comprising:

a switch, coupled to said at least one respective load element, for producing at least one respective switch output signal for each said at least one input signal;

at least one shaper determining at least one respective shaper output signal, for each said at least one input signal, according to each said at least one input signal and said at least one respective switch output signal;

a power source array, coupled to said switch, said power source array including at least one power source;

a power reservoir array, coupled to said switch, said power reservoir array including at least one power reservoir;

an active load array coupled to said switch, said active load array including at least one active load element; and a controller, coupled to said at least one shaper and to said switch, said controller determining a switching scheme according to at least a selected one of said at least one respective shaper output signal, wherein said switch applies said switching scheme to said at least one respective load element, to said power source array, to said active load array and to said power reservoir array;

wherein the active impedance of at least a selected one of said at least one active load element is determined according to system signals provided by said system.

66. The system according to claim 65, wherein said system signals include at least one of the list consisting of:

at least a selected one of said at least one respective shaper output signal; and at least one of controller commands, provided by said controller.

67. The system according to claim 66, wherein said system signals further include at least one of said at least one respective switch output signal.

68. The system according to claim 65, wherein said controller determines said switching scheme, further according to the source power levels of at least a selected one of said at least one power source.

69. The system according to claim 65, wherein said controller determines said switching scheme, further according to the reservoir power levels of at least a selected one of said at least one power reservoir.

70. The system according to claim 69, wherein said controller determines said switching scheme, further according to the source power levels of at least a selected one of said at least one power source.

71. The system according to claim 65, further comprising a power source monitor coupled to said power source array and to said controller, wherein said power source monitor monitors the source power levels of at least a selected one of said at least one power source and provides information respective of said monitored source power levels to said controller, and wherein said controller determines said switching scheme, further according to said information.

72. The system according to claim 65, further comprising a power reservoir monitor coupled to said power reservoir array and to said controller, wherein said power reservoir monitor monitors the reservoir power levels of at least a selected one of said at least one power reservoir and provides information respective of said monitored reservoir power levels to said controller, and wherein said controller determines said switching scheme, further according to said information.

73. The system according to claim 65, further comprising:

a power source monitor coupled to said power source array and to said controller; and a power reservoir monitor coupled to said power reservoir array and to said controller, wherein said power source monitor monitors the source power levels of at least a selected one of said at least one power source and provides power source information respective of said monitored source power levels to said controller, wherein said power reservoir monitor monitors the reservoir power levels of at least a selected one of said at least one power reservoir and provides power reservoir information respective of said monitored reservoir power levels to said controller, and wherein said controller determines said switching scheme, further according to said power source information and said power reservoir information.

74. The system according to claim 65, wherein the type of each said at least one power source is selected from the list consisting of:

chemical to electrical sources;

physical to electrical sources;

radiation to electrical sources;

heat to electrical sources; and electrical to electrical sources.

75. The system according to claim 65, wherein the type of each said at least one power reservoir is selected from the list consisting of:

capacitor; and inductor.

76. The system according to claim 65, wherein the type of said at least one active load element is selected from the list consisting of:

inductor;

capacitor;

resistor;

electronic circuit; and power-pushing element.

77. The system according to claim 65, wherein at least a selected one of said at least one shaper modifies the respective one of said at least one respective switch output signal, before analyzing said respective one of said at least one respective switch output signal.

78. The system according to claim 65, wherein at least one of said at least one respective shaper output signal is a subsequent best output signal.

79. The system according to claim 65, wherein at least one of said at least one respective shaper output signal is an approximation of a subsequent best output signal.

80. The system according to claim 65, wherein at least one of said at least one respective shaper output signal is a function of a subsequent best output signal.

81. The system according to claim 65, wherein said controller receives at least an additional signal, and wherein said controller determines said switching scheme further according to said at least additional signal.

82. The system according to claim 81, wherein said at least additional signal includes at least a selected one of said at least one input signal.

83. The system according to claim 65, wherein said controller determines new switching schemes at spaced-apart time intervals.

84. The system according to claim 65, wherein said controller determines new switching schemes in real time.

85. The system according to claim 65, wherein said controller determines new switching schemes in real time upon satisfaction of a predetermined condition.

86. The system according to claim 65, further comprising at least one signal generator, coupled to said at least one shaper, wherein said at least one signal generator produces at least a selected one of said at least one input signal.

87. The system according to claim 65, wherein said switching scheme includes at least a selected one of said at least one power source.

88. The system according to claim 65, wherein said switching scheme includes at least a selected one of said at least one power reservoir.

89. The system according to claim 88, wherein said switching scheme includes at least a selected one of said at least one power source.

90. The system according to claim 65, wherein said switching scheme includes at least one component of the list consisting of:
- at least a selected one of said at least one power reservoir;
- at least a selected one of said at least one power source;
- at least a selected one of said at least one active load element; and
- at least a selected one of said at least one respective load element.

91. The system according to claim 65, wherein said switching scheme is series.

92. The system according to claim 65, wherein said switching scheme is parallel.

93. The system according to claim 65, wherein said switching scheme is mixed, having parallel and series connections.

94. The system according to claim 65, wherein at least one of said at least one shaper adjusts respective shaper parameters, according to system signals provided by said system.

95. The system according to claim 94, wherein said system signals include at least one of the list consisting of:
- at least a selected one of said at least one input signal;
- at least a selected one of the reservoir power levels of a selected one of said at least one power reservoir;
- at least a selected one of the source power levels of a selected one of said at least one power source; and
- at least a selected one of said at least one respective switch output signal.

96. The system according to claim 65, wherein said controller operates according to a switching scheme selection policy and wherein said controller adjusts said switching scheme selection policy according to system signals provided by said system.

97. The system according to claim 96, wherein said system signals include at least one of the list consisting of:
- at least a selected one of said at least one input signal;
- at least a selected one of the reservoir power levels of a selected one of said at least one power reservoir; and
- at least a selected one of the source power levels of a selected one of said at least one power source.

98. Method for amplifying at least one input signal, thereby producing at least one respective amplified input signal, to be provided to at least one respective load element, the method comprising the steps of:
- analyzing said at least one input signal and at least one respective feedback signal, thereby determining at least one respective desired output signal, to be applied to the said at least one respective load element;
- determining a switching scheme according to at least a signal selected from the list consisting of:
  - at least a selected one of said at least one desired output signal;
  - at least a selected one of said at least one input signal;
  - at least a selected one of the source power levels of at least one power source;
  - at least a selected one of the reservoir power levels of at least one power reservoir; and
  - system signals, and
- applying said switching scheme to at least a selected one of said at least one respective load element.

99. The method according to claim 98, wherein said switching scheme includes at least a selected one of at least one power source.

100. The method according to claim 98, wherein said switching scheme includes at least a selected one of at least one power reservoir.

101. The method according to claim 100, wherein said switching scheme further includes at least a selected one of at least one power source.

102. The method according to claim 98, wherein said switching scheme further includes at least a selected one of at least one active load element.

103. The method according to claim 99, wherein said switching scheme further includes at least a selected one of at least one active load element.

104. The method according to claim 100, wherein said switching scheme further includes at least a selected one of at least one active load element.

105. The method according to claim 101, wherein said switching scheme includes at least a selected one of at least one active load element.

106. The method according to claim 99, wherein the type of each said at least one power source is selected from the list consisting of:
- chemical to electrical sources;
- physical to electrical sources;
- radiation to electrical sources;
- heat to electrical sources; and
- electrical to electrical sources.

107. The method according to claim 100, wherein the type of each said at least one power reservoir is selected from the list consisting of:
- capacitor; and
- inductor.

108. The method according to claim 102, wherein the type of said at least one active load element is selected from the list consisting of:
- inductor;
- capacitor;
- resistor;
- electronic circuit; and
- power-pushing element.

109. The method according to claim 98, wherein at least one of said at least one respective desired output signal is a subsequent best output signal.

110. The method according to claim 98, wherein at least one of said at least one respective desired output signal is an approximation of a subsequent best output signal.

111. The method according to claim 98, wherein at least one of said at least one respective desired output signal is a function of a subsequent best output signal.

112. The method according to claim 98, wherein said switching scheme is series.

113. The method according to claim 98, wherein said switching scheme is parallel.

114. The method according to claim 98, wherein said switching scheme is mixed, having parallel and series connections.

115. The method according to claim 98, wherein said switching scheme is determined at spaced-apart time intervals.

116. The method according to claim 98, wherein said switching scheme is determined in real time.

117. The method according to claim 98, wherein said switching scheme is determined in real-time upon satisfaction of a predetermined condition.

118. The method according to claim 98, wherein each said at least one respective feedback signal is selected from the list consisting of:

a respective one of said at least one respective amplified input signal; and a modified respective one of said at least one respective amplified input signal.

119. The method according to claim 98, further comprising the step of receiving said at least one input signal prior to the step of analyzing said at least one input signal.

120. The method according to claim 98, further comprising a step of monitoring the source power levels of a selected one of at least one power source.

121. The method according to claim 98, further comprising a step of monitoring the reservoir power levels of a selected one of at least one power reservoir.

122. The method according to claim 98, further comprising a step of setting active load impedance to at least one active load element.

123. The method according to claim 98, further comprising a step of adjusting the active load impedance of at least one active load element according to system signals.

124. The method according to claim 123, wherein said system signals include at least one of the list consisting of:

at least a selected one of said at least one respective desired output signal; and at least a selected one of said at least one respective amplified input signal.

125. The method according to claim 98, further comprising a step of adjusting the analysis procedure used in said step of analyzing, according to system signals.

126. The method according to claim 125, wherein said system signals include at least one of the list consisting of:

at least a selected one of said at least one input signal;

at least a selected one of the reservoir power levels of at least one power reservoir;

at least a selected one of the source power levels of at least one power source;

at least a selected one of said at least one respective input amplified signal; and at least a selected one of said at least one respective feedback signal.

127. The method according to claim 98, further comprising a step of adjusting the determination policy of said step of determining a switching scheme, according to system signals.

128. The system according to claim 127, wherein said system signals include at least one of the list consisting of:

at least a selected one of said at least one input signal;

at least a selected one the reservoir power levels of at least one power reservoir; and at least a selected one of the source power levels of at least one power source.

* * * * *